US012727501B2

(12) United States Patent
Hokazono

(10) Patent No.: US 12,727,501 B2
(45) Date of Patent: Sep. 1, 2026

(54) BONDING TOOL, SEMICONDUCTOR DEVICE MANUFACTURING METHOD, AND SEMICONDUCTOR DEVICE

(71) Applicant: FUJI ELECTRIC CO., LTD., Kawasaki (JP)

(72) Inventor: Hiroaki Hokazono, Hachioji-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 354 days.

(21) Appl. No.: 18/359,020

(22) Filed: Jul. 26, 2023

(65) Prior Publication Data

US 2024/0079375 A1 Mar. 7, 2024

(30) Foreign Application Priority Data

Sep. 5, 2022 (JP) ................................ 2022-140709

(51) Int. Cl.
*H10W 72/00* (2026.01)

(52) U.S. Cl.
CPC .. *H10W 72/0115* (2026.01); *H10W 72/07141* (2026.01); *H10W 72/07531* (2026.01)

(58) Field of Classification Search
CPC ................ H01L 24/745; H01L 24/741; H01L 2224/78343; H01L 2224/858; H01L 24/85; H01L 24/81; H01L 21/4821; H01L 21/4846; H01L 23/49861; H10W 72/0115; H10W 72/07531
USPC .......................................... 257/784; 438/617
See application file for complete search history.

(56) References Cited

U.S. PATENT DOCUMENTS

2006/0180635 A1* 8/2006 Lim ...................... B23K 20/10 228/110.1
2009/0008775 A1* 1/2009 Tanaka .................... H01L 24/48 257/737
2016/0365330 A1* 12/2016 Hagiwara ............... H01L 24/85
2019/0009357 A1* 1/2019 Miyashiro ........... B23K 20/106
(Continued)

FOREIGN PATENT DOCUMENTS

CN 202780227 U 3/2013
JP 2012152792 A 8/2012
JP 2017-074611 A 4/2017
(Continued)

OTHER PUBLICATIONS

1st Office Action for corresponding DE Patent Application No. 102023119933.1 dated Oct. 24, 2025.
(Continued)

*Primary Examiner* — Didarul A Mazumder
(74) *Attorney, Agent, or Firm* — Rabin & Berdo, P.C.

(57) ABSTRACT

A bonding tool for bonding two conductive plates in contact with each other by pressing the bonding tool against the two conductive plates while vibrating a bonding end portion thereof in a direction parallel to the conductive plates. The bonding end portion of the bonding tool includes a bonding base having an end surface, the end surface having a protrusion area that has two sides facing and parallel to each other in a first direction that is parallel to the end surface, a plurality of protrusions provided in the protrusion area of the end surface, and a suppression portion provided on the end surface along the two sides of the protrusion area. The bonding end portion is configured to vibrate in the first direction.

13 Claims, 20 Drawing Sheets

(56) References Cited

U.S. PATENT DOCUMENTS

2019/0054562 A1 * 2/2019 Miyashiro ......... B29C 66/81435

FOREIGN PATENT DOCUMENTS

JP 2018156841 A 10/2018
JP 2021-150320 A 9/2021

OTHER PUBLICATIONS

Office Action issued for corresponding Japanese Patent Application No. 2022-140709, and its English translation, dated Jun. 2, 2026.

* cited by examiner

10
X X
12 12
12a
12b 12b
13a1 13b1
13b2
Y Y
13a2 13b3
13a3
13b4
13a4
13a5 13b5
13a 11b3 11b2 11a 11b1 13b
X
11

BONDING TOOL, SEMICONDUCTOR DEVICE MANUFACTURING METHOD, AND SEMICONDUCTOR DEVICE

CROSS-REFERENCE TO RELATED APPLICATION

This application is based upon and claims the benefit of priority of the prior Japanese Patent Application No. 2022-140709, filed on Sep. 5, 2022, the entire contents of which are incorporated herein by reference.

BACKGROUND OF THE INVENTION

1. Field of the Invention

The embodiments discussed herein relate to a bonding tool, a semiconductor device manufacturing method, and a semiconductor device.

2. Background of the Related Art

Semiconductor devices include power devices and function as a power converter (such as an inverter). Each power device is an insulated gate bipolar transistor (IGBT), a power metal oxide semiconductor field effect transistor (MOSFET), or the like. With the semiconductor devices, semiconductor chips including power devices and insulated circuit boards are laminated. Furthermore, with the semiconductor devices, a wiring member is bonded to a main electrode on the front surface of a semiconductor chip or a wiring board of an insulated circuit board. The wiring member is a wire, a lead frame (external connection terminal), or the like.

A lead frame is bonded to a wiring board in the following way. For example, the lead frame is located on the wiring board and a bonding tool is located over the front surface of the lead frame on the wiring board. The bonding tool presses the lead frame while ultrasonic-vibrating. By doing so, the lead frame is bonded to the wiring board (see, for example, Japanese Laid-open Patent Publication No. 2021-150320).

With this ultrasonic bonding, the bonding tool presses the lead frame while vibrating. As a result, a foreign substance (such as a burr) may be generated. When a semiconductor device operates, the dielectric strength voltage may drop due to such a foreign substance or a short circuit may be caused by such a foreign substance. Accordingly, for example, the following is performed as a method for suppressing the occurrence of a short circuit. Gaps between a plurality of convexities formed in a bonding portion of a bonding tool which comes in contact with an object to be bonded are opened in the same direction and foreign substances are discharged in a determined direction. As a result, the foreign substances face a side of an electrode near an end portion. Accordingly, the foreign substances are less likely to adhere to the electrode, and are removed (see, for example, Japanese Laid-open Patent Publication No. 2017-074611).

The foreign substances may have the shape of a protrusion or a thread. In particular, even if the foreign substances having the shape of a thread are generated in the same direction, an area in which the foreign substances come in contact with a conductor, such as a wiring board or a lead frame, around them is wide. If such foreign substances are generated, then a short circuit may still occur.

SUMMARY OF THE INVENTION

According to an aspect, there is provided a bonding tool for bonding two conductive plates by pressing the bonding tool against the two conductive plates while vibrating the bonding tool in a direction parallel to the conductive plates, the bonding tool including: a bonding end portion including a bonding base having an end surface, the end surface having a protrusion area that has two sides facing and parallel to each other in a first direction that is parallel to the end surface; a plurality of protrusions provided in the protrusion area of the end surface; and a suppression portion provided on the end surface along the two sides of the protrusion area, wherein the bonding end portion is configured to vibrate in the first direction.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described with reference to the accompanying drawings. In the following description, a "front surface" or an "upper surface" indicates an X-Y plane which faces the upper side (+Z direction) in a semiconductor device 1 of FIG. 1. Similarly, an "upside" indicates the upward direction (+Z direction) in the semiconductor device 1 of FIG. 1. A "back surface" or a "lower surface" indicates the X-Y plane which faces the lower side (−Z direction) in the semiconductor device 1 of FIG. 1. Similarly, a "downside" indicates the downward direction (−Z direction) in the semiconductor device 1 of FIG. 1. These terms mean the same directions as needed in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction. Furthermore, in the following description, a "main ingredient" indicates an ingredient contained at a rate of 80 volume percent (vol %) or more. In addition, "approximately equal" may refer to a range that is within ±10%. Moreover, "perpendicular" or "parallel" means that an angle which one object forms with the other object is in the range of 90°±10° or 180°±10°.

First Embodiment

Figure 1:
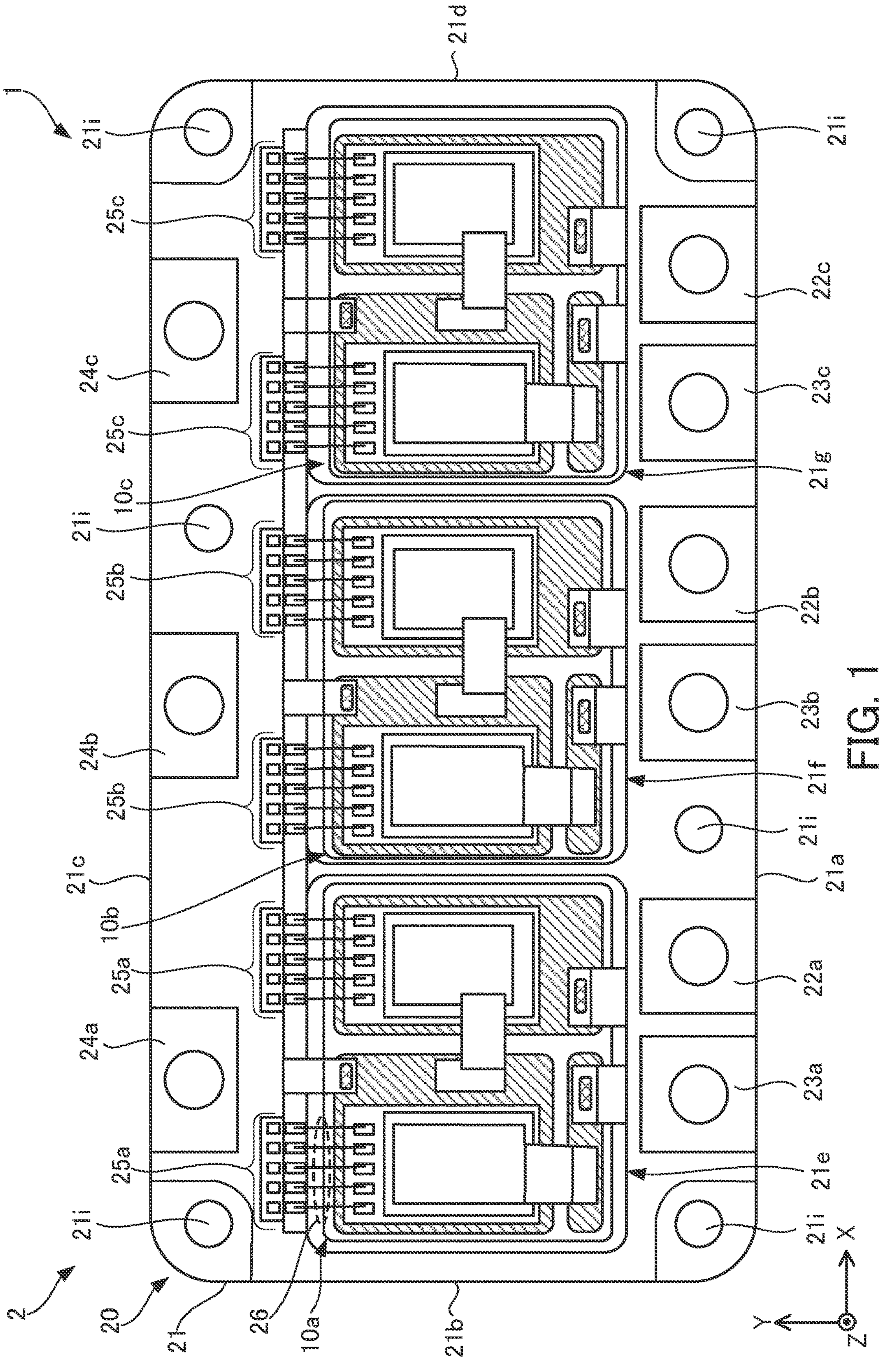
FIG. 1 is a plan view of a semiconductor device according to a first embodiment.
Figure 2:
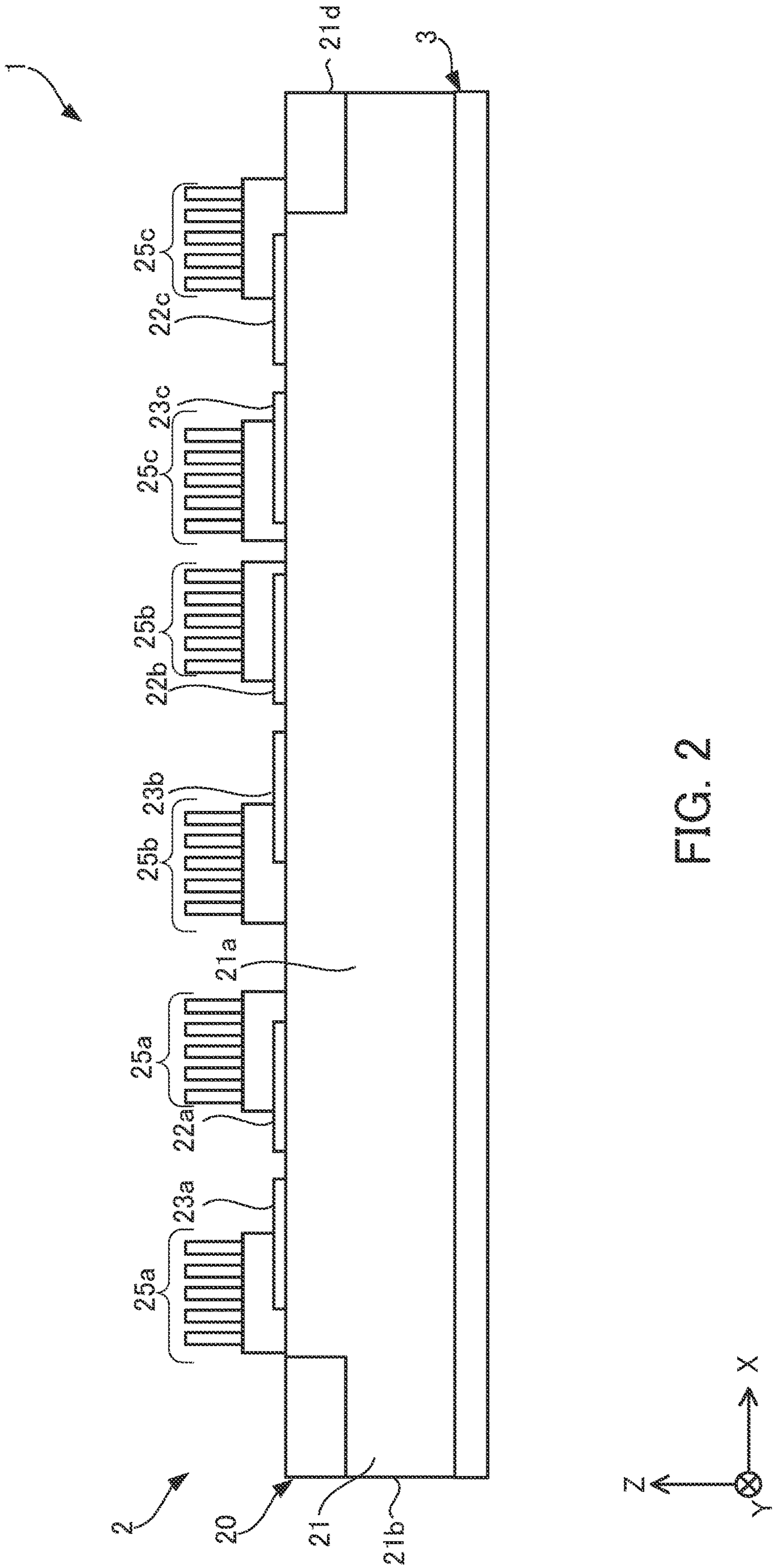
FIG. 2 is a side view of the semiconductor device according to the first embodiment.

A semiconductor device 1 according to a first embodiment will be described with reference to FIG. 1 and FIG. 2. FIG. 1 is a plan view of a semiconductor device according to a first embodiment. FIG. 2 is a side view of the semiconductor device according to the first embodiment. FIG. 2 is a side view obtained by viewing a side parallel to the X-Z plane of the semiconductor device 1 of FIG. 1 in the +Y direction.

The semiconductor device 1 includes a semiconductor module 2 and a radiation plate 3. Furthermore, the semiconductor module 2 includes semiconductor units 10*a*, 10*b*, and 10*c* and an enclosure 20 which houses the semiconductor units 10*a*, 10*b*, and 10*c*. The semiconductor units 10*a*, 10*b*, and 10*c* housed in the enclosure 20 are sealed with a sealing member (not illustrated). The semiconductor units 10*a*, 10*b*, and 10*c* have the same structure. If no distinctions are made among the semiconductor units 10*a*, 10*b*, and 10*c*, then description will be given as the semiconductor units 10. The details of the semiconductor units 10 will be described later.

The enclosure 20 included in the semiconductor module 2 includes an outer frame 21, first connection terminals 22*a*, 22*b*, and 22*c*, second connection terminals 23*a*, 23*b*, and 23*c*, a U-phase output terminal 24*a*, a V-phase output terminal 24*b*, a W-phase output terminal 24*c*, and control terminals 25*a*, 25*b*, and 25*c*.

The outer frame 21 is approximately rectangular in plan view and is surrounded on all sides by outer walls 21*a*, 21*b*, 21*c*, and 21*d*. The outer walls 21*a* and 21*c* correspond to long sides of the outer frame 21 and the outer walls 21*b* and 21*d* correspond to short sides of the outer frame 21. Furthermore, each of corner portions at which the outer walls 21*a*, 21*b*, 21*c*, and 21*d* are connected to one another does not always have a right angle. As illustrated in FIG. 1, each corner portion may be R-chamfered. Fastening holes 21*i* which pierce the outer frame 21 are made in the corner portions of the front surface of the outer frame 21. The fastening holes 21*i* may be made in the corner portions of the outer frame 21 below the front surface of the outer frame 21.

Unit housing portions 21*e*, 21*f*, and 21*g* are demarcated in the front surface of the outer frame 21 along the outer walls 21*a* and 21*c*. The unit housing portions 21*e*, 21*f*, and 21*g* are rectangular in plan view. The semiconductor units 10*a*, 10*b*, and 10*c* are housed in the unit housing portions 21*e*, 21*f*, and 21*g*, respectively. The outer frame 21 is fixed to the front surface of the radiation plate 3 over which the semiconductor units 10*a*, 10*b*, and 10*c* are arranged in the X direction. When the outer frame 21 is fixed to the front surface of the radiation plate 3, the unit housing portions 21*e*, 21*f*, and 21*g* of the outer frame 21 surround (house) the semiconductor units 10*a*, 10*b*, and 10*c*, respectively, arranged over the radiation plate 3.

The outer frame 21 has in plan view the first connection terminals 22*a*, 22*b*, and 22*c* and the second connection terminals 23*a*, 23*b*, and 23*c* on the side of the outer wall 21*a*. One end portions of the first connection terminals 22*a*, 22*b*, and 22*c* and the second connection terminals 23*a*, 23*b*, and 23*c* are exposed on the side of the outer wall 21*a*. The other end portions of the first connection terminals 22*a*, 22*b*, and 22*c* and the second connection terminals 23*a*, 23*b*, and 23*c* are exposed in the unit housing portions 21*e*, 21*f*, and 21*g* and are electrically connected to the semiconductor units 10*a*, 10*b*, and 10*c*. Furthermore, the outer frame 21 has the U-phase output terminal 24*a*, the V-phase output terminal 24*b*, and the W-phase output terminal 24*c* on the side of the outer wall 21*c*. One end portions of the U-phase output terminal 24*a*, the V-phase output terminal 24*b*, and the W-phase output terminal 24*c* are exposed on the side of the outer wall 21*c*. The other end portions of the U-phase output terminal 24*a*, the V-phase output terminal 24*b*, and the W-phase output terminal 24*c* are exposed in the unit housing portions 21*e*, 21*f*, and 21*g* and are electrically connected to the semiconductor units 10*a*, 10*b*, and 10*c*.

In addition, the outer frame 21 houses nuts opposite the openings, in lower portions of openings for the first connection terminals 22*a*, 22*b*, and 22*c* and the second connection terminals 23*a*, 23*b*, and 23*c*. Similarly, the outer frame 21 houses nuts opposite the openings, in lower portions of openings for the U-phase output terminal 24*a*, the V-phase output terminal 24*b*, and the W-phase output terminal 24*c*.

Moreover, the outer frame 21 has the control terminals 25*a*, 25*b*, and 25*c* in plan view on the front surface along sides in the +Y direction of the unit housing portions 21*e*, 21*f*, and 21*g*, respectively (along the outer wall 21*c*). The control terminals 25*a* arranged are divided into two groups. The control terminals 25*b* arranged are divided into two groups. The control terminals 25*c* arranged are divided into two groups. Each of the control terminals 25*a*, 25*b*, and 25*c* has the shape of the letter "J" (or the letter "U") and one end portions of the control terminals 25*a*, 25*b*, and 25*c* extend vertically upward (in the +Z direction) from the side of the outer wall 21*c* of the outer frame 21. The other end portions of the control terminals 25*a*, 25*b*, and 25*c* are exposed in the −Y direction from the side of the outer wall 21*c* of the unit housing portions 21*e*, 21*f*, and 21*g*, respectively.

The above outer frame 21 includes the first connection terminals 22*a*, 22*b*, and 22*c*, the second connection terminals 23*a*, 23*b*, and 23*c*, the U-phase output terminal 24*a*, the V-phase output terminal 24*b*, the W-phase output terminal 24*c*, and the control terminals 25*a*, 25*b*, and 25*c* and is integrally molded therewith by injection molding by the use of a thermoplastic resin such as polyphenylene sulfide resin, polybutylene terephthalate resin, polybutylene succinate resin, polyamide resin, or acrylonitrile butadiene styrene resin. By doing so, the enclosure 20 is formed.

Furthermore, the first connection terminals 22*a*, 22*b*, and 22*c*, the second connection terminals 23*a*, 23*b*, and 23*c*, the U-phase output terminal 24*a*, the V-phase output terminal 24*b*, the W-phase output terminal 24*c*, and the control terminals 25*a*, 25*b*, and 25*c* are made of metal, such as copper, aluminum, or an alloy containing at least one of them as a main ingredient, having good electrical conductivity. Plating treatment may be performed on the surfaces of the first connection terminals 22*a*, 22*b*, and 22*c*, the second connection terminals 23*a*, 23*b*, and 23*c*, the U-phase output terminal 24*a*, the V-phase output terminal 24*b*, the W-phase output terminal 24*c*, and the control terminals 25*a*, 25*b*, and 25*c*. At this time, nickel, a nickel-phosphorus alloy, a nickel-boron alloy, or the like is used as a plating material.

The unit housing portions 21*e*, 21*f*, and 21*g* of the outer frame 21 are filled with the sealing member to seal the semiconductor units 10 in the unit housing portions 21*e*, 21*f*, and 21*g*. At this time, the other end portions of the first connection terminals 22*a*, 22*b*, and 22*c*, the second connection terminals 23*a*, 23*b*, and 23*c*, the U-phase output terminal 24*a*, the V-phase output terminal 24*b*, the W-phase output terminal 24*c*, and the control terminals 25*a*, 25*b*, and 25*c* in the unit housing portions 21*e*, 21*f*, and 21*g* are sealed with the sealing member. The sealing member may be a thermosetting resin such as epoxy resin, phenolic resin, maleimide resin, or polyester resin. The sealing member is preferably epoxy resin. In addition, a filler may be added to the sealing member. The filler is a ceramic having an insulating property and high thermal conductivity.

The radiation plate 3 is rectangular in plan view and has the shape of a flat plate. Each corner portion of the radiation plate 3 may be R-chamfered in plan view. Furthermore, insertion holes corresponding to the fastening holes 21*i* are made in plan view in the radiation plate 3. The semiconductor module 2 is located over the front surface of the radiation plate 3 with a bonding member described later therebetween. A cooler may be formed on the back surface of the radiation plate 3. The cooler includes a plurality of radiation fins in an area corresponding to a disposition area of the semiconductor module 2, a continuously circular side wall which surrounds the plurality of radiation fins, and a bottom plate which stops an opening in the side wall. A pump is connected to the cooler. A refrigerant circulates through the cooler by the pump. That is to say, the pump makes the refrigerant flow into the cooler. The refrigerant which flows in circulates through the cooler. At this time, the refrigerant receives heat from the semiconductor module 2. As a result, the semiconductor module 2 is cooled. The refrigerant which receives the heat from the semiconductor module 2 is discharged to the outside of the cooler. The refrigerant circulates through the cooler in this way by the pump. Alternatively, only a plurality of radiation fins may be formed on the back surface of the radiation plate 3. In this case, air cooling is performed.

Figure 3:
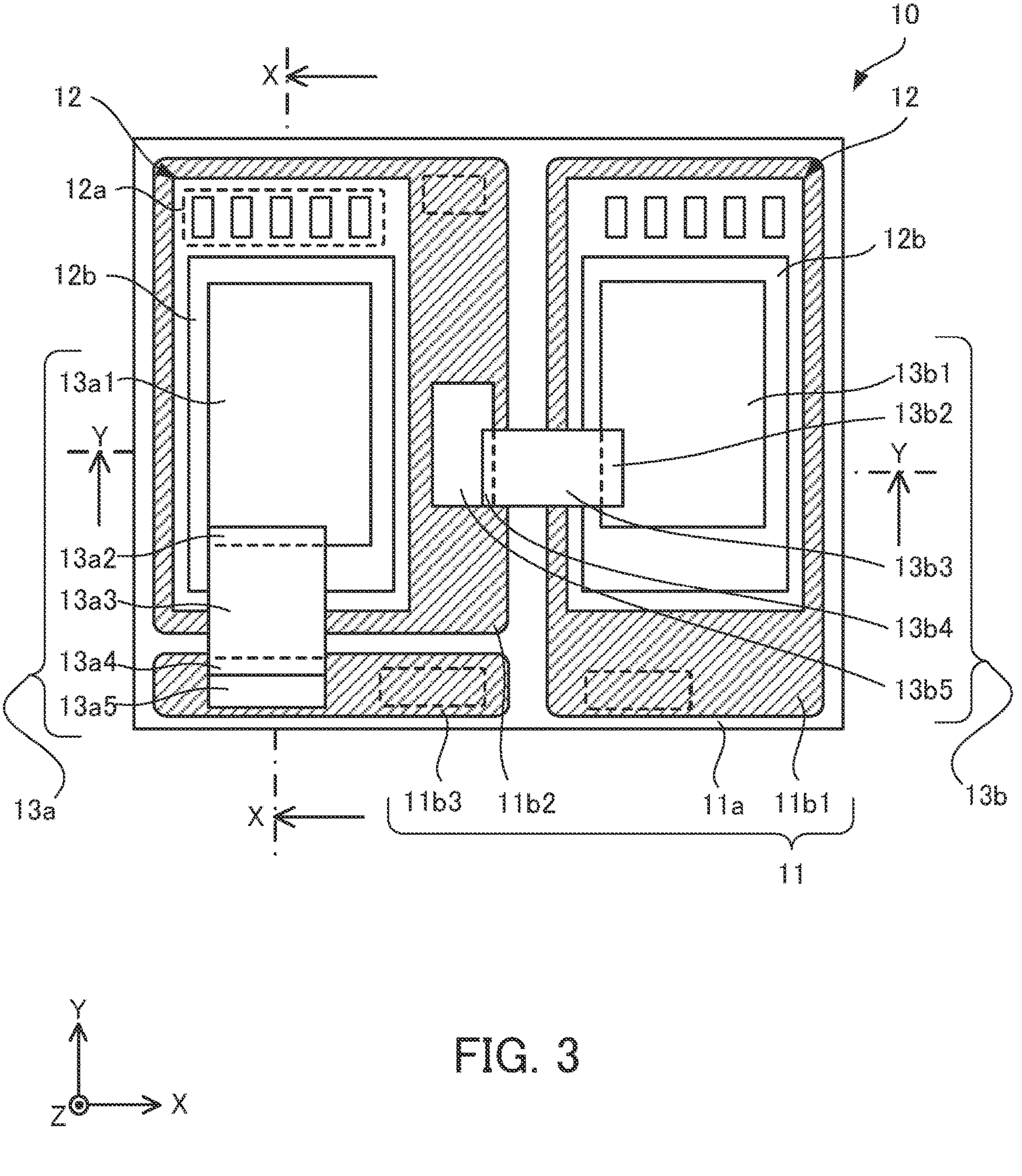
FIG. 3 is a plan view of a semiconductor unit included in the semiconductor device according to the first embodiment.
Figure 4:
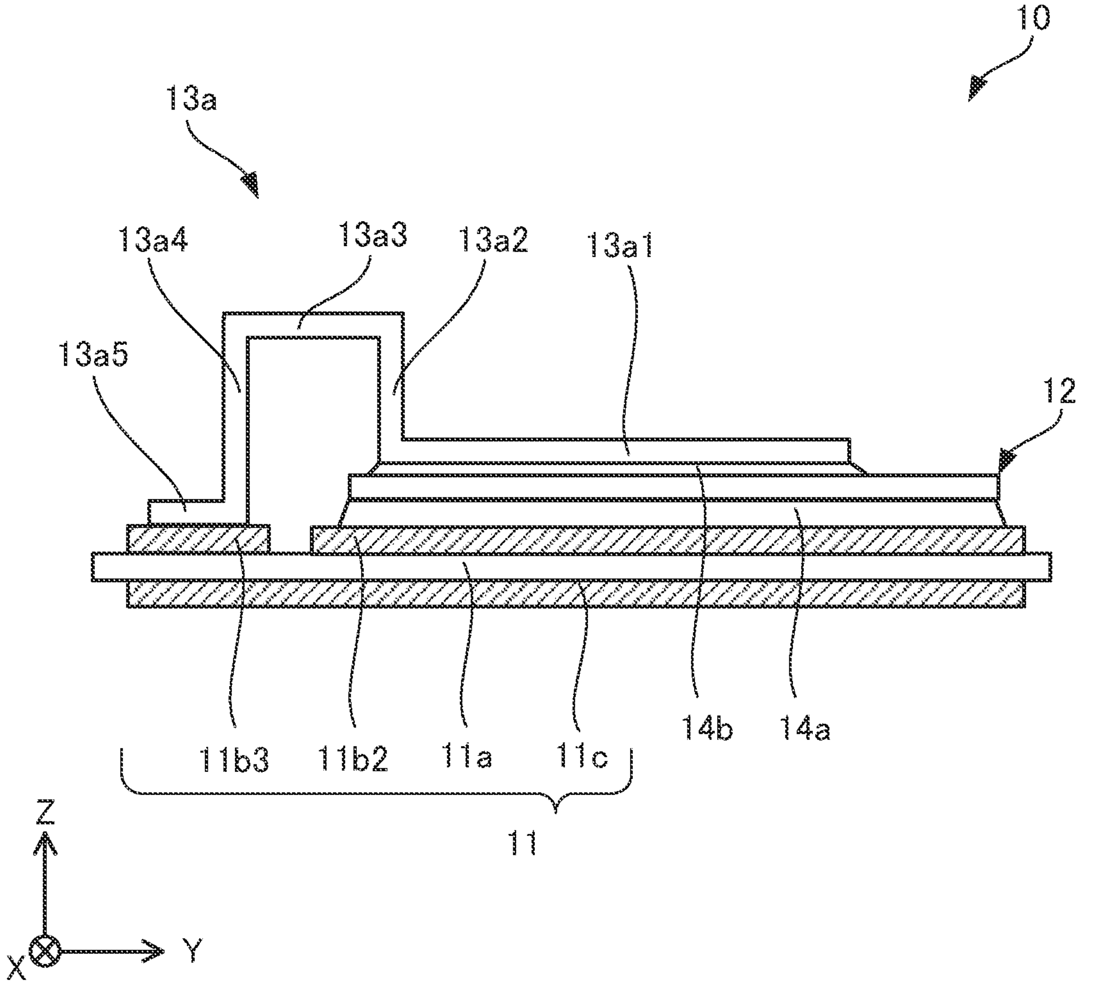
FIG. 4 is a sectional view of the semiconductor unit included in the semiconductor device according to the first embodiment (part 1)
Figure 5:
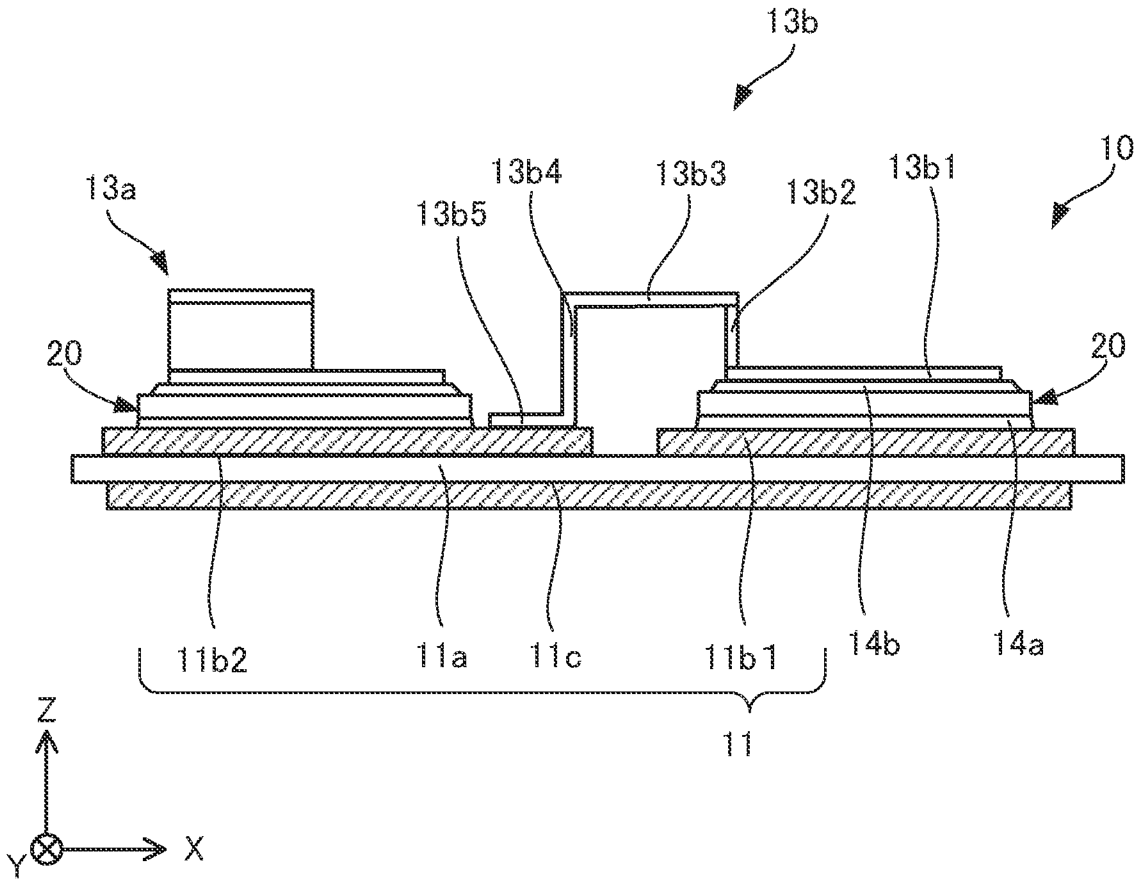
FIG. 5 is a sectional view of the semiconductor unit included in the semiconductor device according to the first embodiment (part 2)

The semiconductor units 10*a*, 10*b*, and 10*c* (semiconductor units 10) will now be described with reference to FIGS. 3 through 5. FIG. 3 is a plan view of a semiconductor unit included in the semiconductor device according to the first embodiment. FIGS. 4 and 5 are sectional views of the semiconductor unit included in the semiconductor device according to the first embodiment. FIG. 4 is a sectional view taken along the dot-dash line X-X of FIG. 3. FIG. 5 is a sectional view taken along the dot-dash line Y-Y of FIG. 3.

Each of the semiconductor units 10 includes an insulated circuit board 11, two semiconductor chips 12, and two lead frames 13*a* and 13*b*. The semiconductor chips 12 are bonded to the insulated circuit board 11 with a bonding member 14*a*. Furthermore, the lead frames 13*a* and 13*b* are bonded to main electrodes 12*b* on the front surfaces of the semiconductor chips 12 with a bonding member 14*b*. The lead frames 13*a* and 13*b* may be bonded to the insulated circuit board 11 by ultrasonic bonding in place of the bonding member 14*b*.

The insulated circuit board 11 includes an insulating plate 11*a*, wiring boards 11*b*1, 11*b*2, and 11*b*3, and a metal plate 11*c*. The insulating plate 11*a* and the metal plate 11*c* are rectangular in plan view. Furthermore, corner portions of the insulating plate 11*a* and the metal plate 11*c* may be R-chamfered or C-chamfered. The size of the metal plate 11*c* is smaller in plan view than that of the insulating plate 11*a* and the metal plate 11*c* is formed inside the insulating plate 11*a*.

The insulating plate 11*a* has an insulating property and is made of a material, such as a ceramic, having high thermal conductivity. The ceramic is aluminum oxide, aluminum nitride, silicon nitride, or the like.

The wiring boards 11*b*1, 11*b*2, and 11*b*3 are formed over the front surface of the insulating plate 11*a*. The wiring boards 11*b*1, 11*b*2, and 11*b*3 are made of metal having good electrical conductivity. Such metal is copper, aluminum, an alloy containing at least one of them as a main ingredient, or the like. In addition, for example, the thickness of the wiring boards 11*b*1, 11*b*2, and 11*b*3 is larger than or equal to 0.1 mm and smaller than or equal to 2.0 mm. In order to improve corrosion resistance, plating treatment may be performed on the surfaces of the wiring boards 11*b*1, 11*b*2, and 11*b*3. At this time, nickel, a nickel-phosphorus alloy, a nickel-boron alloy, or the like is used as a plating material.

The wiring board 11*b*1 occupies an area corresponding to half of the front surface of the insulating plate 11*a* on the side of a side in the +X direction and extending from a side in the −Y direction to a side in the +Y direction. End portions of the first connection terminals 22*a*, 22*b*, and 22*c* are bonded to an area (bonding area) in the wiring board 11*b*1 enclosed by a dashed line. At this time, ultrasonic bonding may be used.

The wiring board 11*b*2 occupies an area corresponding to half of the front surface of the insulating plate 11*a* on the side of a side in the −X direction. Furthermore, the area occupied by the wiring board 11*b*2 extends from the side of the front surface of the insulating plate 11*a* in the +Y direction to this side of the side of the front surface of the insulating plate 11*a* in the −Y direction. End portions of the U-phase output terminal 24*a*, the V-phase output terminal 24*b*, and the W-phase output terminal 24*c* are bonded to an area (bonding area) in the wiring board 11*b*2 enclosed by a dashed line. At this time, ultrasonic bonding may be used.

The wiring board 11*b*3 occupies an area on the front surface of the insulating plate 11*a* enclosed by the wiring boards 11*b*1 and 11*b*2. End portions of the second connection terminals 23*a*, 23*b*, and 23*c* are bonded to an area (bonding area) in the wiring board 11*b*3 enclosed by a dashed line. At this time, ultrasonic bonding may be used.

The above wiring boards 11*b*1, 11*b*2, and 11*b*3 are formed in the following way on the front surface of the insulating plate 11*a*. A metal layer is formed on the front surface of the insulating plate 11*a* and treatment, such as etching, is performed on the metal layer. By doing so, the wiring boards 11*b*1, 11*b*2, and 11*b*3 each having a determined shape are obtained. Alternatively, the wiring boards 11*b*1, 11*b*2, and 11*b*3 cut in advance out of a metal plate may be pressure-bonded to the front surface of the insulating plate 11*a*. The wiring boards 11*b*1, 11*b*2, and 11*b*3 are taken as an example. The number, shape, size, or position of wiring boards may be properly selected as needed.

The metal plate 11*c* is formed on the back surface of the insulating plate 11*a*. The metal plate 11*c* is rectangular. The area of the metal plate 11*c* is smaller in plan view than that of the insulating plate 11*a* and is larger in plan view than the total area of the wiring boards 11*b*1, 11*b*2, and 11*b*3. The corner portions of the metal plate 11*c* may be R-chamfered or C-chamfered. The size of the metal plate 11*c* is smaller than that of the insulating plate 11*a* and is formed on the entire back surface except an edge portion of the insulating plate 11*a*. The metal plate 11*c* contains as a main ingredient metal having high thermal conductivity. Such metal is copper, aluminum, an alloy containing at least one of them, or the like.

A direct copper bonding (DCB) substrate, an active metal brazed (AMB) substrate, or the like may be used as the insulated circuit board 11 having the above structure. The insulated circuit board 11 may be fixed to the front surface of the radiation plate 3 with a bonding member (not illustrated) therebetween. Heat generated by the semiconductor chips 12 is conducted to the radiation plate 3 via the wiring boards 11*b*1 and 11*b*2, the insulating plate 11*a*, and the metal plate 11*c*. By doing so, the heat is dissipated.

The bonding members 14*a* and 14*b* are solder. Pb-free solder is used as the solder. The Pb-free solder contains as a main ingredient an alloy containing at least two of tin, silver, copper, zinc, antimony, indium, bismuth, and the like. Furthermore, the solder may contain an additive such as nickel, germanium, cobalt, or silicon. The solder containing an additive improves wettability, a gloss, and bonding strength and reliability is improved.

In addition, a brazing filler metal or a thermal interface material may be used as a bonding member (not illustrated) for bonding the semiconductor units 10 and the radiation plate 3 together. The brazing filler metal contains as a main ingredient at least one of an aluminum alloy, a titanium alloy, a magnesium alloy, a zirconium alloy, a silicon alloy, and the like. The thermal interface material is an adhesive containing an elastomer sheet, room temperature vulcanization (RTV) rubber, gel, a phase change material, or the like. By fixing the semiconductor units 10 to the radiation plate 3 with the brazing filler metal or the thermal interface material therebetween, the heat dissipation property of the semiconductor units 10 is improved.

Each semiconductor chip 12 includes a power device element made of silicon. The power device element is a reverse conducting (RC)-insulated gate bipolar transistor (IGBT). The RC-IGBT has both of the function of an IGBT, which is a switching element, and the function of a free wheeling diode (FWD), which is a diode element. In this case, each semiconductor chip 12 has on the front surface a control electrode 12*a* (gate electrode) and an output electrode (emitter electrode), which is a main electrode 12*b*. Each semiconductor chip 12 has on the back surface an input electrode (collector electrode), which is a main electrode. The control electrode 12*a* is located along (or in a central portion on the side of) a side of the front surface of each semiconductor chip 12. The output electrode is located in a central portion of the front surface of each semiconductor chip 12.

In addition, each semiconductor chip 12 may use a switching element and a diode element in place of the RC-IGBT. The switching element is an IGBT, a power metal oxide semiconductor field effect transistor (MOSFET), or the like. The power MOSFET is preferably made of silicon carbide. In this case, for example, each semiconductor chip 12 has on the back surface an input electrode (drain electrode or a collector electrode) as a main electrode and has on the front surface the control electrode 12*a* (gate electrode) and an output electrode (source electrode or an emitter electrode), which is the main electrode 12*b*. The diode element is an FWD such as a Schottky barrier diode (SBD) or a P-intrinsic-N (PiN) diode. In this case, each semiconductor chip 12 has on the back surface an output electrode (cathode electrode) as a main electrode and has on the front surface input electrode (anode electrode) as a main electrode.

The lead frames 13*a* and 13*b* electrically connect the semiconductor chips 12 and the wiring boards 11*b*1, 11*b*2, and 11*b*3. As a result, wiring is performed between the semiconductor chips 12 and the wiring boards 11*b*1, 11*b*2, and 11*b*3 via the lead frames 13*a* and 13*b*. Each of the semiconductor units 10 may be an inverter circuit corresponding to one phase. The lead frame 13*a* directly connects the main electrode 12*b* of the semiconductor chip 12 (over the wiring board 11*b*2) and the wiring board 11*b*3. The lead frame 13*b* directly connects the main electrode 12*b* of the semiconductor chip 12 (over the wiring board 11*b*1) and the wiring board 11*b*2.

As illustrated in FIGS. 3 through 5, the lead frames 13*a* and 13*b* integrally include main electrode bonding portions 13*a*1 and 13*b*1, first vertical connecting portions 13*a*2 and 13*b*2, horizontal connecting portions 13*a*3 and 13*b*3, second vertical connecting portions 13*a*4 and 13*b*4, and wiring bonding portions 13*a*5 and 13*b*5, respectively. Each of the lead frames 13*a* and 13*b* as a whole has the same thickness and has the shape of a flat plate. Each of the lead frames 13*a* and 13*b* may be formed by bending each portion. The lead frames 13*a* and 13*b* are made of metal, such as copper, aluminum, or an alloy containing at least one of them as a main ingredient, having good electrical conductivity. In order to improve corrosion resistance, plating treatment may be performed on the surfaces of the lead frames 13*a* and 13*b*. At this time, nickel, a nickel-phosphorus alloy, a nickel-boron alloy, or the like is used as a plating material.

Each of the main electrode bonding portions 13*a*1 and 13*b*1 has the shape of a flat plate. The main electrode bonding portions 13*a*1 and 13*b*1 are bonded to the main electrodes 12*b* of the semiconductor chips 12 (over the wiring boards 11*b*2 and 11*b*1, respectively) with the bonding member 14*b*. The wiring bonding portions 13*a*5 and 13*b*5 may be bonded to the wiring boards 11*b*3 and 11*b*2, respectively, with the above bonding member or by ultrasonic bonding.

The first vertical connecting portion 13*a*2, the horizontal connecting portion 13*a*3, the second vertical connecting portion 13*a*4, and the wiring bonding portion 13*a*5 of the lead frame 13*a* have the same width. This width corresponds to length in a direction (in the ±X direction) perpendicular to the wiring direction (±Y direction) of the lead frame 13*a*. The first vertical connecting portion 13*b*2, the horizontal connecting portion 13*b*3, and the second vertical connecting portion 13*b*4 of the lead frame 13*b* have the same width. This width corresponds to length in a direction (in the ±Y direction) perpendicular to the wiring direction (±X direction) of the lead frame 13*b*.

Furthermore, the control electrodes 12*a* of the semiconductor chips 12 of the semiconductor units 10*a*, 10*b*, and 10*c* housed in the unit housing portions 21*e*, 21*f*, and 21*g* of the enclosure 20 are connected mechanically and electrically to the other end portions of the control terminals 25*a*, 25*b*, and 25*c*, respectively, by wires 26. Each wire 26 contains as a main ingredient a material, such as gold, copper, aluminum, or an alloy containing at least one of them, having good electrical conductivity. Each wire 26 is preferably an aluminum alloy containing a very small amount of silicon. In addition, for example, the diameter of the wires 26 is larger than or equal to 100 μm and smaller than or equal to 400 μm.

Figure 6:
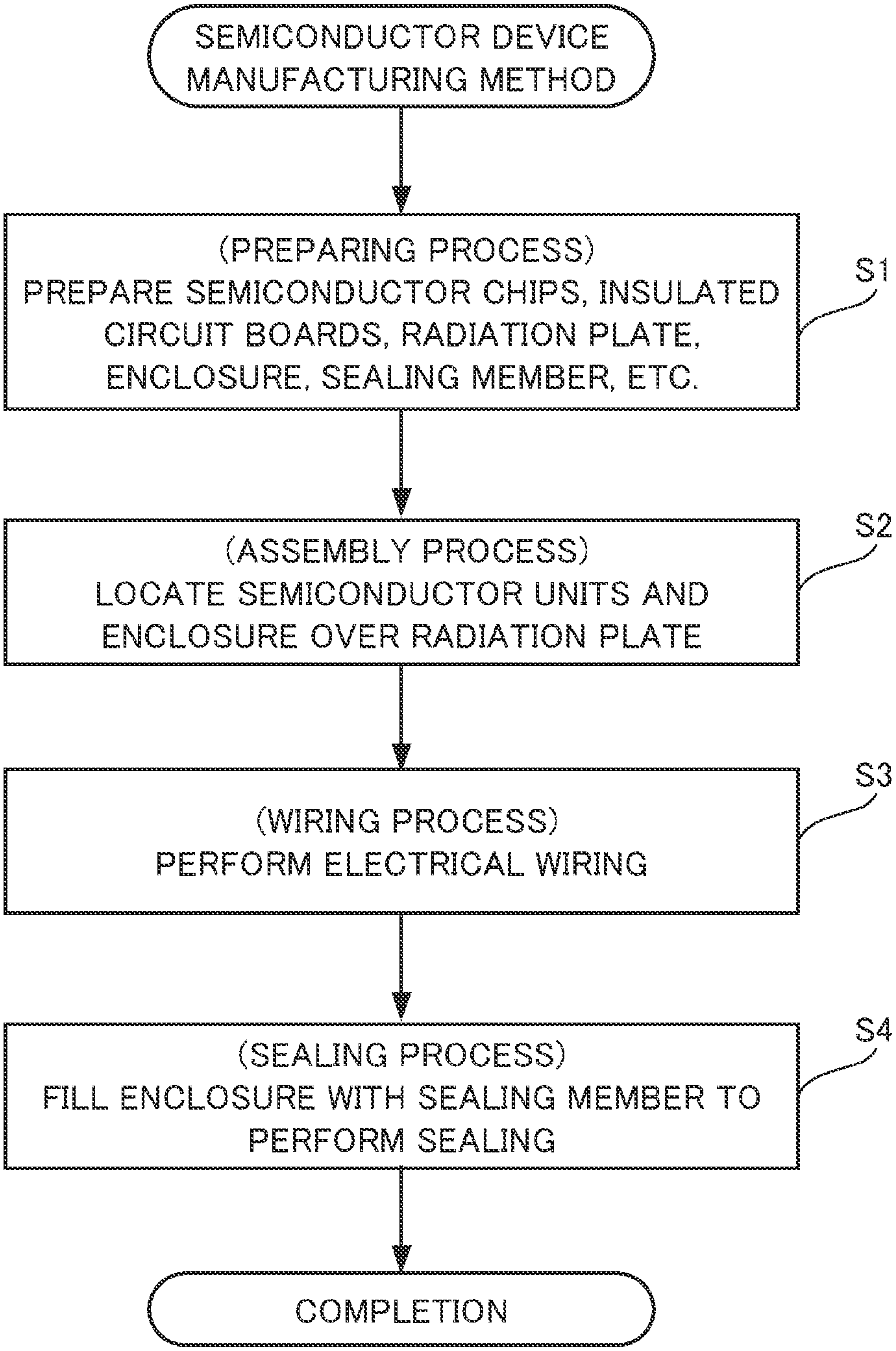
FIG. 6 is a flow chart of a method for manufacturing the semiconductor device according to the first embodiment.

A method for manufacturing the above semiconductor device 1 will now be described with reference to FIG. 6. FIG. 6 is a flow chart of a method for manufacturing the semiconductor device according to the first embodiment. First, a preparing process for preparing the components of the semiconductor device 1 and apparatus for manufacturing the semiconductor device 1 is performed (step S1 of FIG. 6). The components of the semiconductor device 1, such as the semiconductor chips 12, the insulated circuit boards 11, the radiation plate 3, the enclosure 20, a sealing member, and the lead frames 13*a* and 13*b*, are prepared. In addition, the semiconductor chips 12 are bonded to the insulated circuit boards 11 and the lead frames 13*a* and 13*b* are bonded. By doing so, the semiconductor units 10 are assembled in advance. Not only the components but also apparatus used in the method for manufacturing the semiconductor device 1 are prepared. Such apparatus are an ultrasonic bonding apparatus, a wire bonder, a dispenser for resin sealing, and the like.

Next, an assembly process for bonding the semiconductor units 10 to the radiation plate 3 and locating the enclosure 20 over the radiation plate 3 is performed (step S2 of FIG. 6). The semiconductor units 10 are bonded to the radiation plate 3 with a bonding member therebetween. The enclosure 20 is fixed to the radiation plate 3 with an adhesive. At this time, the semiconductor units 10 are housed in the unit housing portions 21*e*, 21*f*, and 21*g* of the enclosure 20.

Figure 7:
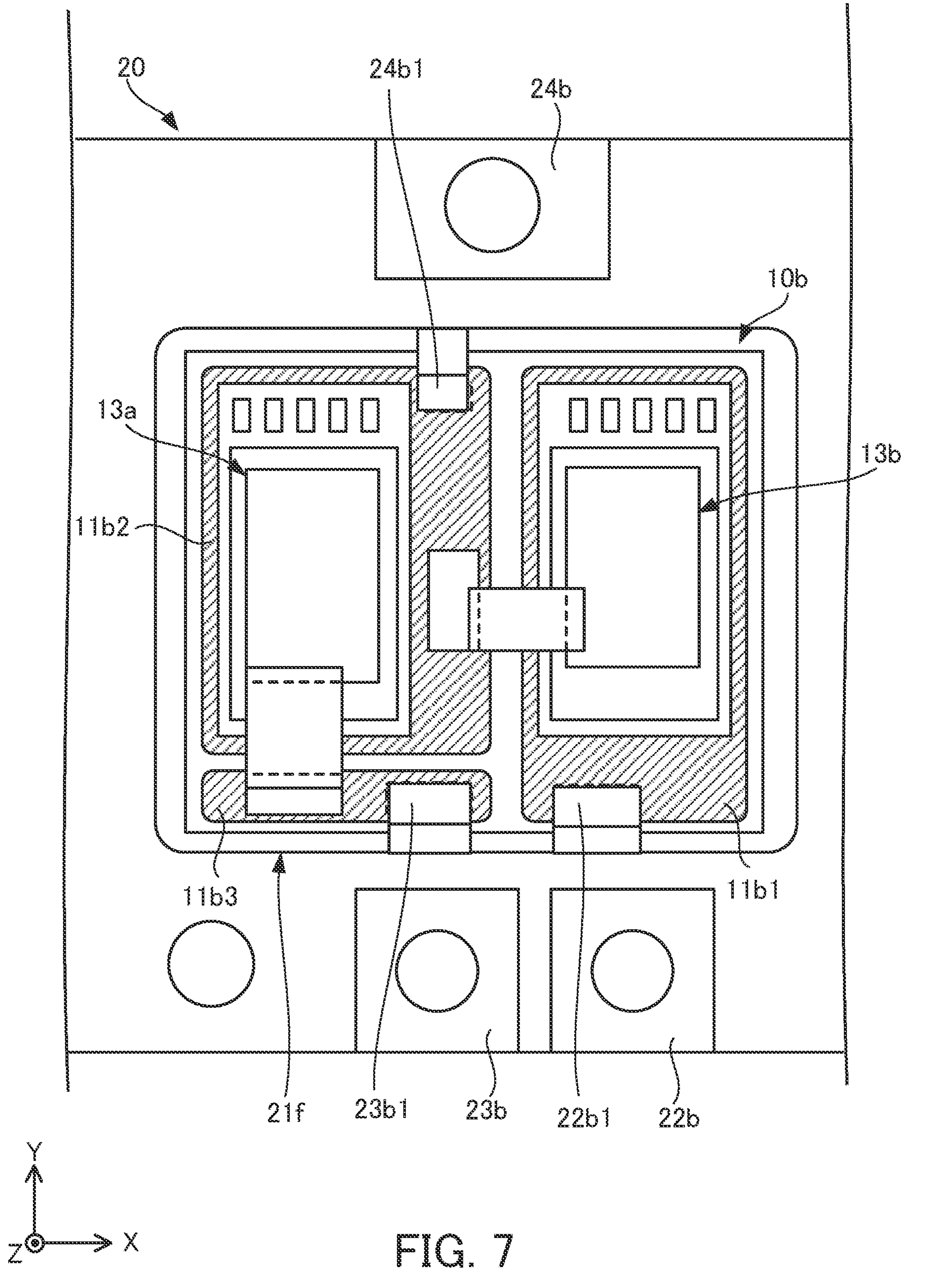
FIG. 7 illustrates an assembly process included in the method for manufacturing the semiconductor device according to the first embodiment.

The semiconductor units 10 assembled in this way and housed in the enclosure 20 will be described with reference to FIG. 7. FIG. 7 illustrates an assembly process included in the method for manufacturing the semiconductor device according to the first embodiment. FIG. 7 illustrates the semiconductor unit 10*b* housed in the unit housing portion 21*f* of the enclosure 20.

With the semiconductor unit 10*b* housed in the unit housing portion 21*f*, a first bonding portion 22*b*1 of the first connection terminal 22*b* is located over the wiring board 11*b*1. A third bonding portion 24*b*1 of the V-phase output terminal 24*b* is located over the wiring board 11*b*2. A second bonding portion 23*b*1 of the second connection terminal 23*b* is located over the wiring board 11*b*3. With the semiconductor units 10*a* and 10*c* housed in the unit housing portions 21*e* and 21*g*, respectively, bonding portions of terminals are located in the same way over the wiring boards 11*b*1 through 11*b*3.

Next, a wiring process for performing wiring on the semiconductor units 10 is performed (step S3 of FIG. 6). In the wiring process, electrical wiring is performed between terminals and the semiconductor units 10 by the use of a wiring member.

First, the control electrodes 12*a* of the semiconductor chips 12 included in the semiconductor units 10 housed in the enclosure 20 and the control terminals 25*a*, 25*b*, and 25*c* integrally molded with the enclosure 20 are bonded together with the wires 26 by the use of the bonder. For the wires 26 used for bonding, refer to FIG. 1.

Furthermore, the bonding portion (conductive plate) 22*b*1 of the terminal 22*b*, the bonding portion (conductive plate) 23*b*1 of the terminal 23*b*, and the bonding portion (conductive plate) of the terminal 24*b* located over the wiring boards (conductive plates) 11*b*1, 11*b*3, 11*b*2 of the semiconductor units 10 are bonded to the wiring boards 11*b*1, 11*b*3, 11*b*2 by ultrasonic bonding by the ultrasonic bonding apparatus including a bonding tool. The bonding tool included in the ultrasonic bonding apparatus will now be described with reference to FIGS. 8 through 11B.

Figure 8:
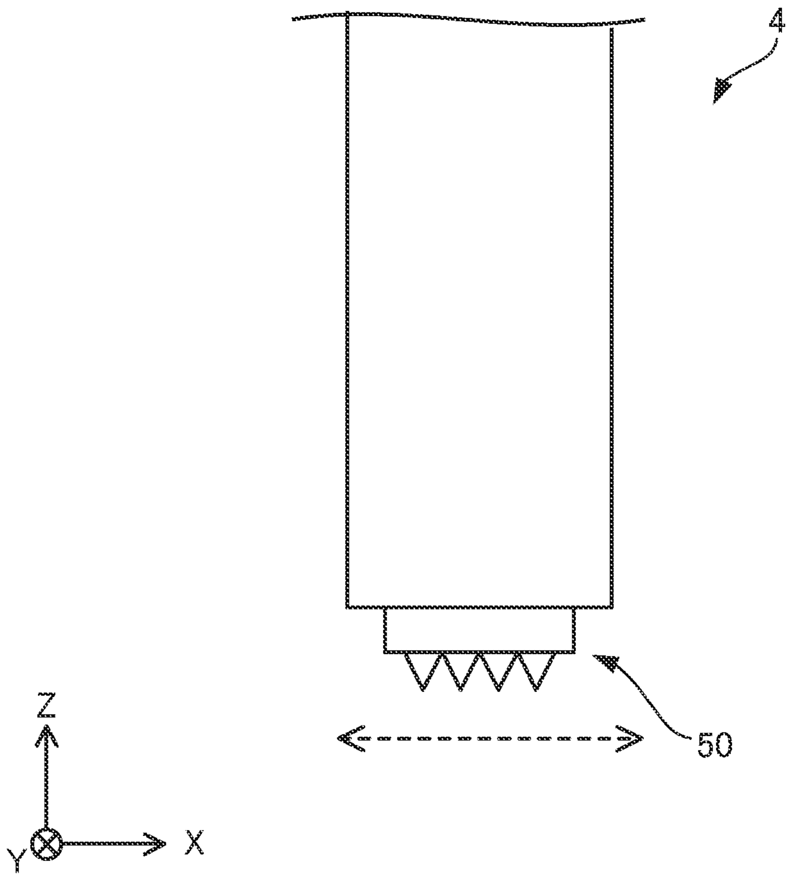
FIG. 8 is a side view of a bonding tool used in a wiring process included in the method for manufacturing the semiconductor device according to the first embodiment.
Figure 9:
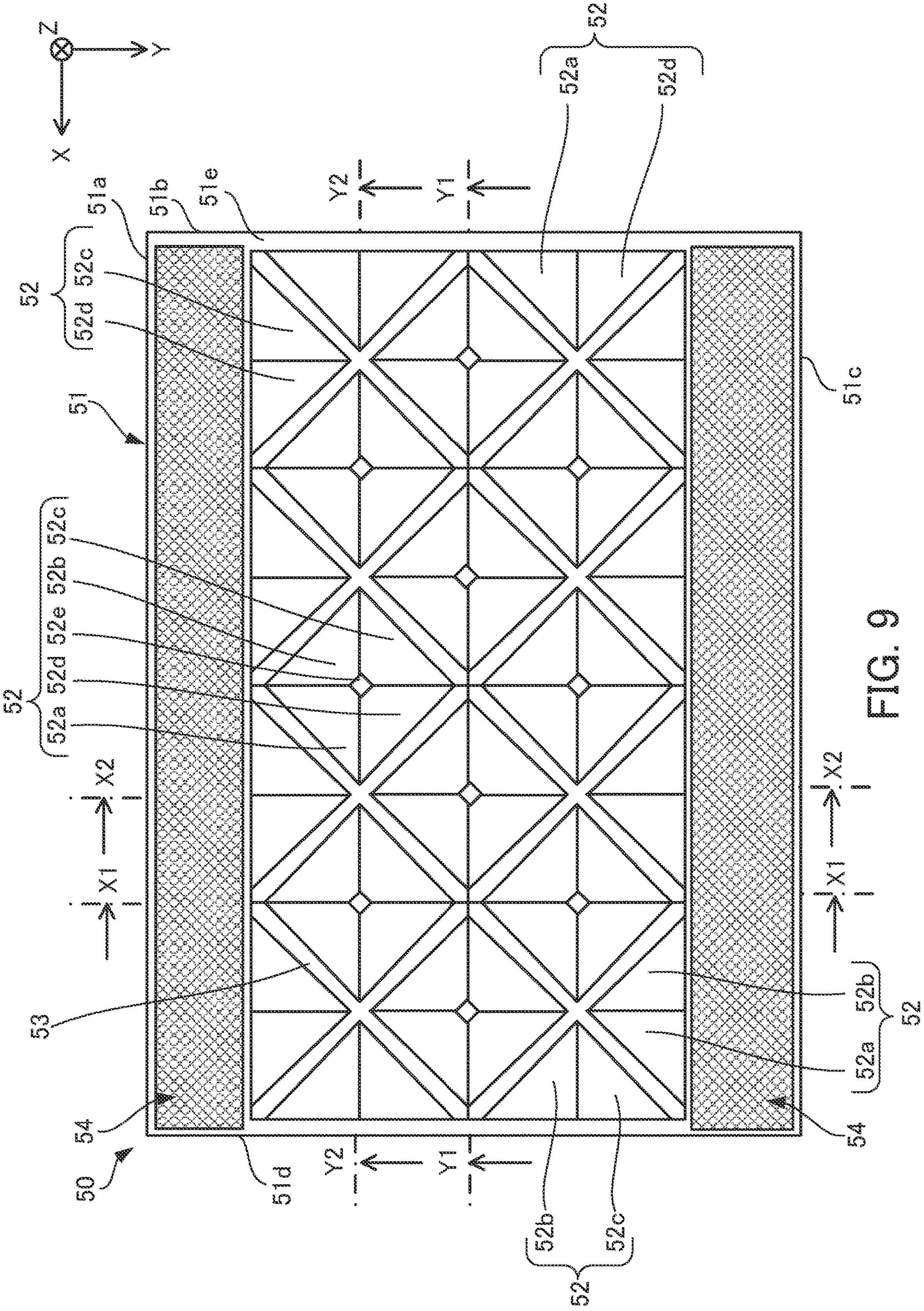
FIG. 9 is a plan view of a bonding end portion of the bonding tool used in the wiring process included in the method for manufacturing the semiconductor device according to the first embodiment.
Figure 10A:
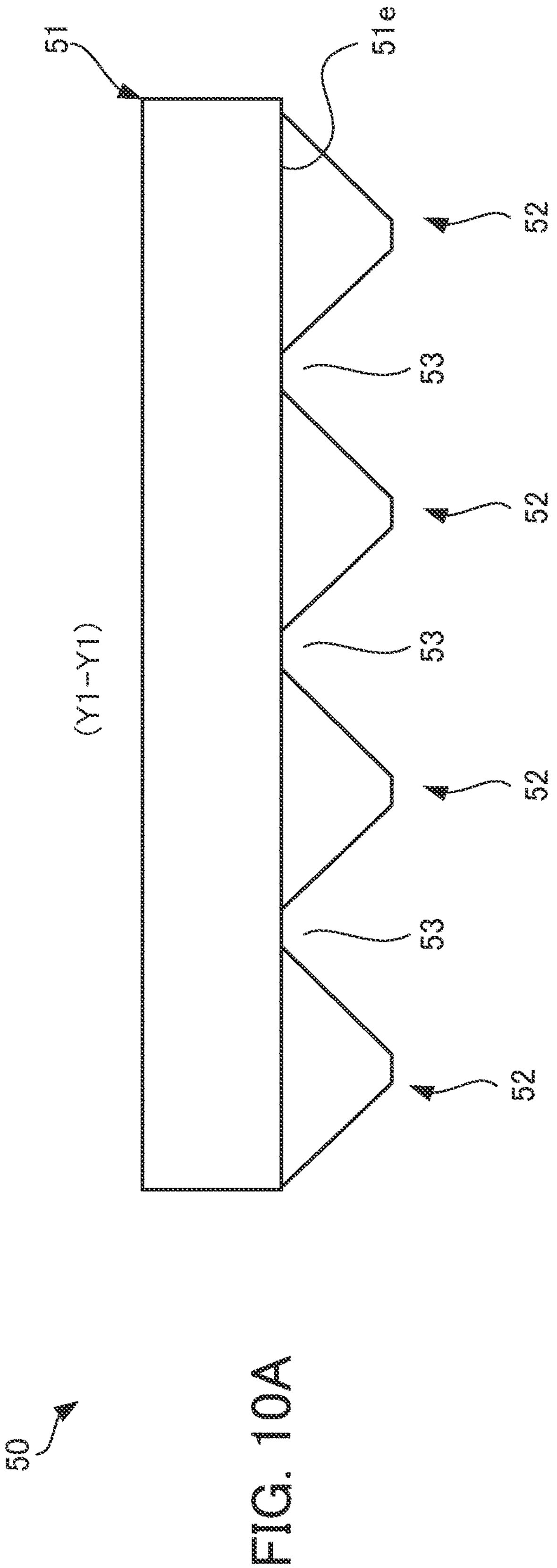
FIGS. 10A and 10B are sectional views of the bonding end portion of the bonding tool used in the wiring process included in the method for manufacturing the semiconductor device according to the first embodiment (part 1)
Figure 10B:
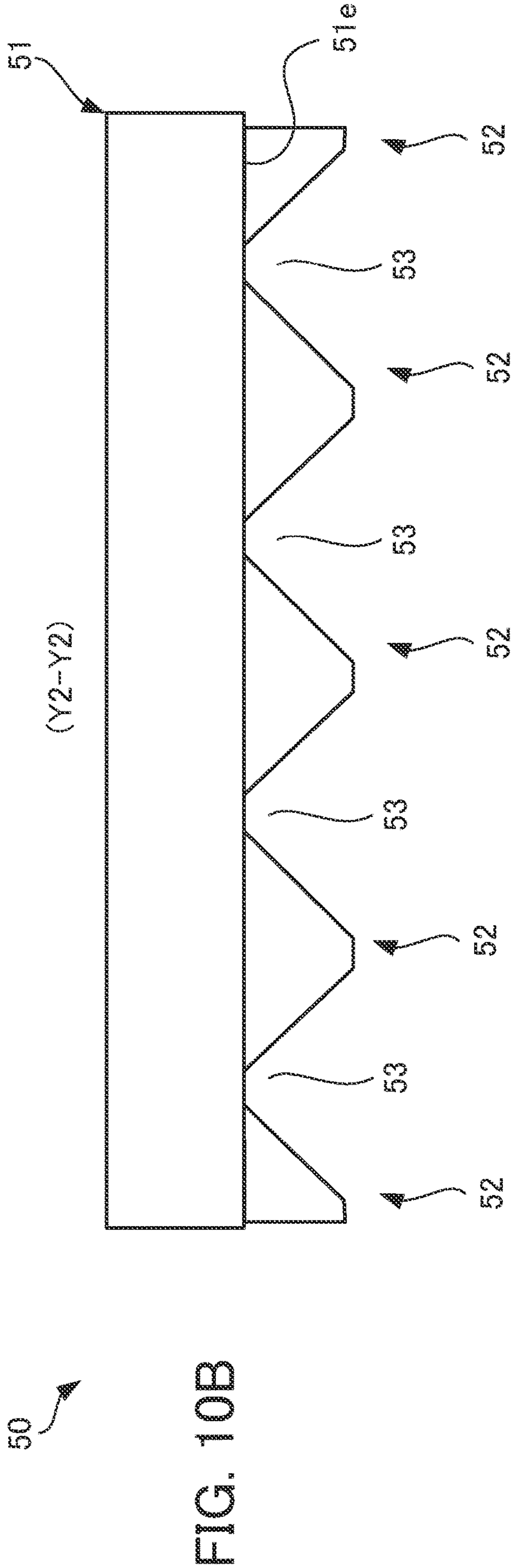
Figure 11A:
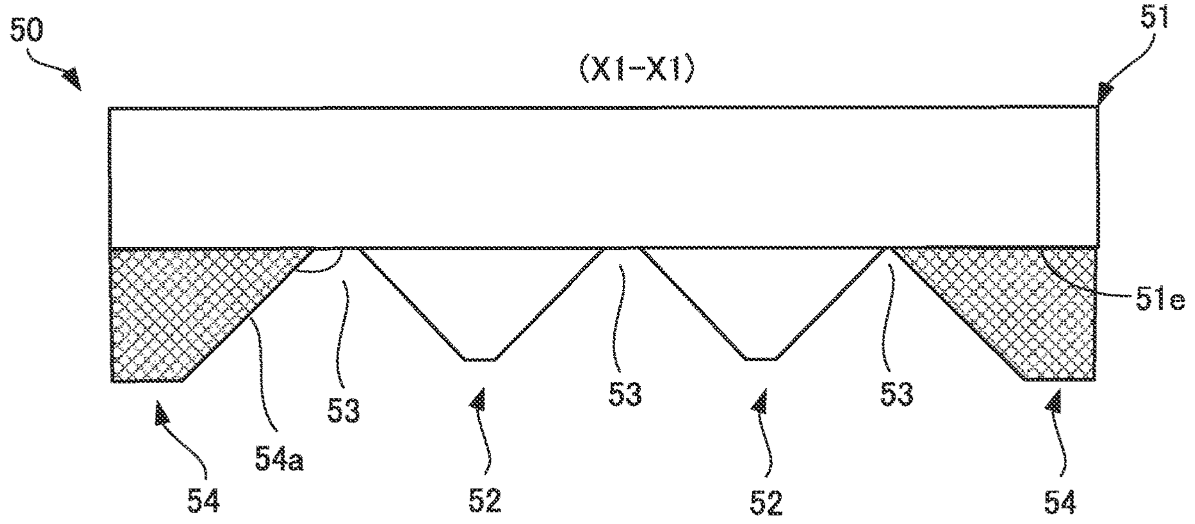
FIGS. 11A and 11B are sectional views of the bonding end portion of the bonding tool used in the wiring process included in the method for manufacturing the semiconductor device according to the first embodiment (part 2)
Figure 11B:
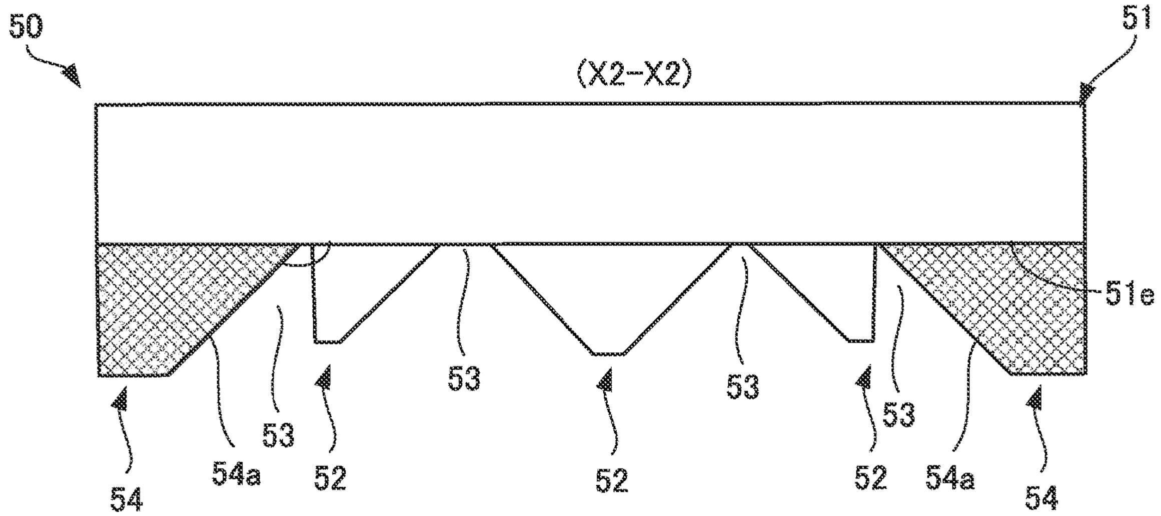

FIG. 8 is a side view of a bonding tool used in a wiring process included in the method for manufacturing the semiconductor device according to the first embodiment. FIG. 9 is a plan view of a bonding end portion of the bonding tool used in the wiring process included in the method for manufacturing the semiconductor device according to the first embodiment. FIGS. 10A and 10B and FIGS. 11A and 11B are sectional views of the bonding end portion of the bonding tool used in the wiring process included in the method for manufacturing the semiconductor device according to the first embodiment. FIG. 8 is a side view obtained when a bonding tool 4 located over each bonding portion is viewed from the +Y direction. FIGS. 10A and 10B are sectional views taken along the dot-dash lines Y1-Y1 and Y2-Y2, respectively, of FIG. 9. FIGS. 11A and 11B are sectional views taken along the dot-dash lines X1-X1 and X2-X2, respectively, of FIG. 9.

The bonding tool 4 illustrated in FIG. 8 has the shape of a pole and vibrates in a determined direction by a vibration generator included in the ultrasonic bonding apparatus. The shape of a pole may be the shape of a cylinder or a prism. The determined direction may be a direction parallel to the X-Y plane. The bonding tool 4 includes a bonding end portion 50 in an end portion (in the −Z direction of FIG. 8). The bonding end portion 50 comes in contact with an object to be bonded, and presses the object to be bonded while vibrating in a specified direction. By doing so, bonding is performed.

As illustrated in FIG. 9, the bonding end portion 50 includes a bonding base 51, a plurality of protrusions 52, and a suppression portion 54. The bonding base 51, the plurality of protrusions 52, and the suppression portion 54 included in the bonding end portion 50 may be made of the same material. For example, such a material is a hard metal material such as tungsten, tungsten carbide, or an alloy containing at least one of them.

The bonding base 51 is at an end of the bonding end portion 50 which comes in contact with an object to be bonded. The bonding base 51 is rectangular in plan view and includes a flat end surface 51*e* approximately parallel to the X-Y plane and a long side portion 51*a*, a short side portion

51*b*, a long side portion 51*c*, and a short side portion 51*d* which surround the end surface 51*e* on all sides. For example, each of the long side portion 51*a*, the short side portion 51*b*, the long side portion 51*c*, and the short side portion 51*d* may be a side wall perpendicular to the X-Y plane. The bonding end portion 50 included in the bonding tool 4 vibrates in a direction (first direction) parallel to the long side portions 51*a* and 51*c* and bonds the object to be bonded. The plurality of protrusions 52 is provided in a protrusion area set within the end surface 51*e*. As explained later, the protrusion area has two sides that face and are parallel to each other in the direction where the bonding tool 4 vibrates. In this embodiment, the two sides are parallel to the long side portions 51*a* and 51*c*. The suppression portion 54 is provided at least along the two sides of the protrusion area.

The plurality of protrusions 52 and the end surface 51*e* may be integrally formed. Each protrusion 52 has the shape of a quadrangular pyramid and includes sides 52*a* through 52*d*. In this case, each protrusion 52 includes a flat pressing surface 52*e* at the peak portion. Furthermore, protrusions 52, of the plurality of protrusions 52, arranged along the peripheral edge of the end surface 51*e* have the shape of half of a quadrangular pyramid. Each of protrusions 52 arranged on the side of the long side portion 51*a* of the end surface 51*e* includes sides 52*c* and 52*d*. Each of protrusions 52 arranged on the side of the short side portion 51*b* of the end surface 51*e* includes sides 52*a* and 52*d*. Each of protrusions 52 arranged on the side of the long side portion 51*c* of the end surface 51*e* includes sides 52*a* and 52*b*. Each of protrusions 52 arranged on the side of the short side portion 51*d* of the end surface 51*e* includes sides 52*b* and 52*c*. Accordingly, the plurality of protrusions 52 may be formed in a zigzag or grid pattern. The arrangement of the plurality of protrusions 52 is an example. Furthermore, each protrusion 52 having the shape of a quadrangular pyramid is an example. Each protrusion 52 may have the shape of a polygonal pyramid or a circular cone. The plurality of protrusions 52 are formed on the end surface 51*e* with gaps 53 therebetween. The bottom surface (not illustrated) of each of the plurality of pyramid- or cone-shaped protrusions 52 contacts the end surface 51*e*. The bottom surfaces of the plurality of protrusions 52 are disposed on the end surface 51*e* to have the gaps 53 between one another.

The suppression portion 54 is formed on at least the outer periphery of the end surface 51*e* parallel to a direction in which the bonding tool 4 vibrates. In this case, the suppression portion 54 is formed along the long side portions 51*a* and 51*c* on the outer periphery of the end surface 51*e* so as to stop the whole of both side portions of the plurality of protrusions 52. Accordingly, the suppression portion 54 stops gaps 53 between the plurality of protrusions 52 exposed on the sides of the long side portions 51*a* and 51*c*. The suppression portion 54 and the end surface 51*e* may be integrally formed. Furthermore, the suppression portion 54 includes a suppression surface 54*a*. The suppression surface 54*a* faces the plurality of protrusions 52. The suppression surface 54*a* may be perpendicular to the end surface 51*e*. Alternatively, the suppression surface 54*a* may incline with respect to the end surface 51*e* and form an obtuse angle with the end surface 51*e*. In this case, an example in which the suppression surface 54*a* inclines with respect to the end sur face 51*e* is taken.

In addition, the height of the suppression portion 54 from the end surface 51*e* may be approximately equal to the height of the plurality of protrusions 52 from the end surface 51*e* or be greater than the height of the plurality of protrusions 52 from the end surface 51*e*. If the height of the suppression portion 54 from the end surface 51*e* is too small, then exposure of generated foreign substances described later is not suppressed. Furthermore, if the height of the suppression portion 54 from the end surface 51*e* is too great, then the object to be bonded is damaged. In this case, for example, the height of the suppression portion 54 from the end surface 51*e* is greater than or equal to 100 percent of the height of the plurality of protrusions 52 from the end surface 51*e* and smaller than or equal to 150 percent of the height of the plurality of protrusions 52 from the end surface 51*e*.

Furthermore, the height of the plurality of protrusions 52 from the end surface 51*e* is greater than or equal to 15 percent of the thickness of the object to be bonded and smaller than or equal to 90 percent of the thickness of the object to be bonded. It is assumed that the height of the plurality of protrusions 52 from the end surface 51*e* is smaller than 15 percent of the thickness of the object to be bonded. When bonding is performed with the bonding end portion 50 including the plurality of protrusions 52, the object to be bonded is ground and damaged. In addition, if the height of the plurality of protrusions 52 from the end surface 51*e* is greater than 90 percent of the thickness of the object to be bonded, then the object to be bonded may fracture. In this embodiment, for example, the height of the plurality of protrusions 52 from the end surface 51*e* is greater than or equal to 0.15 mm. Moreover, for example, pitches between the pressing surfaces 52*e* of the plurality of protrusions 52 are longer than or equal to 1.5 times the height of the plurality of protrusions 52 and shorter than or equal to 2.5 times the height of the plurality of protrusions 52.

Figure 12:
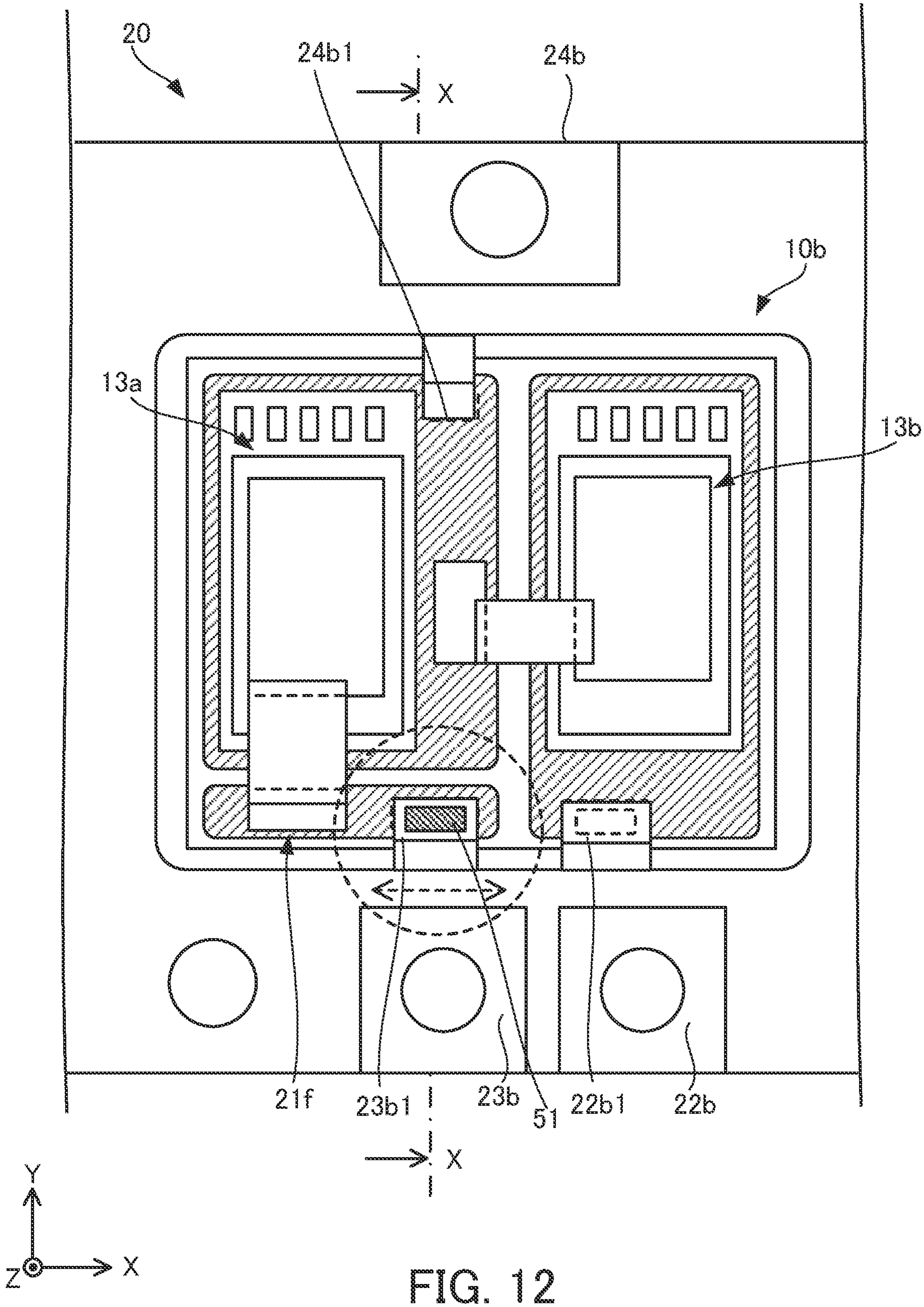
FIG. 12 illustrates bonding in the wiring process included in the method for manufacturing the semiconductor device according to the first embodiment (part 1)
Figure 13:
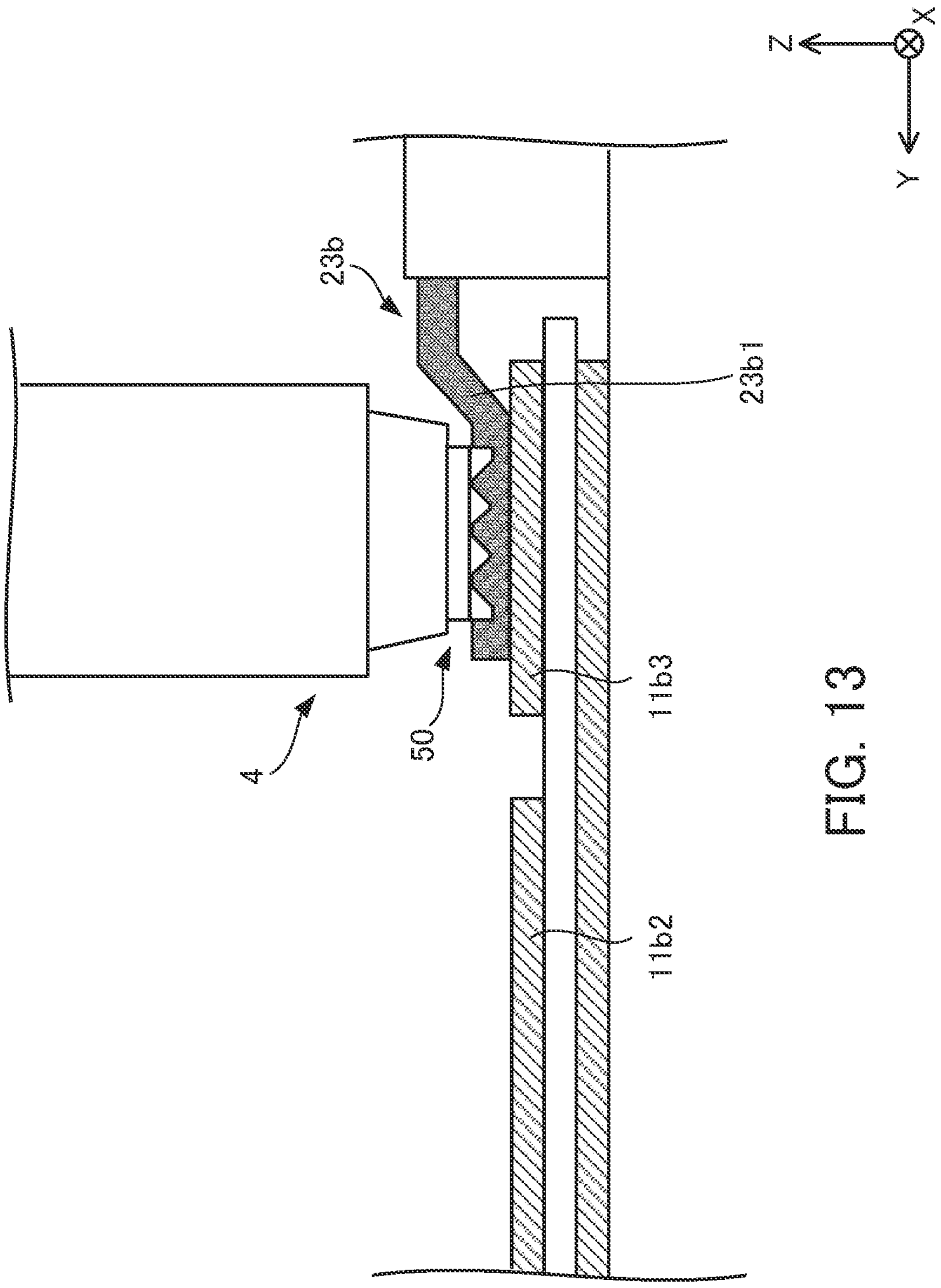
FIG. 13 illustrates bonding in the wiring process included in the method for manufacturing the semiconductor device according to the first embodiment (part 2)

Bonding performed in the wiring process by the use of the above bonding tool 4 will be described with reference to FIG. 12 and FIG. 13. FIGS. 12 and 13 illustrate bonding in the wiring process included in the method for manufacturing the semiconductor device according to the first embodiment. FIG. 12 is a plan view of the semiconductor unit 10*b*. Furthermore, the position of the bonding end portion 50 of the bonding tool 4 which presses the second bonding portion 23*b*1 against the wiring board 11*b*3 is hatched. FIG. 13 is a sectional view of the vicinity of the second bonding portion 23*b*1 (area in FIG. 12 enclosed by a dashed circle) along the dot-dash line X-X of FIG. 12.

In the following description, a case where the second bonding portion 23*b*1 is bonded to the wiring board 11*b*3 is taken as an example of bonding by the bonding tool 4. This bonding by the bonding tool 4 is also applied to a case where the bonding portions are bonded to the wiring boards 11*b*1 and 11*b*2.

The bonding end portion 50 of the bonding tool 4 is positioned over the second bonding portion 23*b*1 of the second connection terminal 23*b* located over the wiring board 11*b*3. When this positioning is performed, the long side portions 51*a* and 51*c* of the bonding end portion 50 of the bonding tool 4 are parallel to the X direction. After the positioning is performed in this way, the bonding tool 4 is dropped so as to come in contact with the front surface of the second bonding portion 23*b*1.

The bonding end portion 50 of the bonding tool 4 presses the second bonding portion 23*b*1 against the wiring board 11*b*3, while vibrating in the X direction. By doing so, the pressing surfaces 52*e* of the plurality of protrusions 52 presses the front surface of the second bonding portion 23*b*1 and the plurality of protrusions 52 cut into the front surface of the second bonding portion 23*b*1. As a result, impressions are formed by the plurality of protrusions 52 on the front surface of the second bonding portion **23*b*1. Furthermore, because the second bonding portion 23*b*1 is pressed against the wiring board 11*b*3 by the bonding tool 4, burrs generated so as to extrude in the ±Y directions from the sides of the second bonding portion 23*b*1 parallel to the X direction are suppressed by the suppression portion 54 (suppression surface 54*a*) of the bonding end portion 50. Accordingly, the use of the bonding tool 4 prevents burrs from extruding in the ±Y directions, and the second bonding portion 23*b*1 of the second connection terminal 23*b* is bonded to the wiring board 11*b*3**. The details of the burrs (foreign substances) generated at this time will be given in a reference example described later.

The width (length in the X direction in FIG. 12) of the second bonding portion **23*b*1 is determined from the current density and heat dissipation characteristics of the semiconductor device 1. For example, the width of the second bonding portion 23*b*1 is greater than or equal to 2 mm and smaller than or equal to 10 mm. Furthermore, the length of the long side portions 51*a* and 51*c* of the bonding end portion 50 is also selected between 2 and 10 mm. The width of an area of the second bonding portion 23*b*1 bonded to the wiring board 11*b*3 is also greater than or equal to 2 mm and smaller than or equal to 10 mm according to the length of the long side portions 51*a* and 51*c* of the bonding end portion 50. For example, if the width of the second bonding portion 23*b*1 is 10 mm, then the bonding end portion 50** with a size of 2 millimeters square may be used.

Furthermore, in the first embodiment, a case where the bonding end portion 50 of the bonding tool 4 bonds a central portion of the second bonding portion **23*b*1 is taken as an example. However, an area of the second bonding portion 23*b*1 bonded to the wiring board 11*b*3 is not limited to the central portion. Only part of the peripheral edge or only the corner portions of the second bonding portion 23*b*1 may be bonded to the wiring board 11*b*3. In each case, the peripheral edge of the second bonding portion 23*b*1 bonded to the wiring board 11*b*3 includes a portion not bonded to the wiring board 11*b*3**.

Next, a sealing process for filling the unit housing portions **21*e*, 21*f*, and 21*g* of the enclosure 20 in which the semiconductor units 10 are housed with a sealing member and performing sealing is performed (step S4 of FIG. 6). After the unit housing portions 21*e*, 21*f*, and 21*g* are filled with the sealing member, the sealing member is hardened and the semiconductor units 10 and the like are sealed. By doing so, the semiconductor device 1** is obtained.

Figure 14:
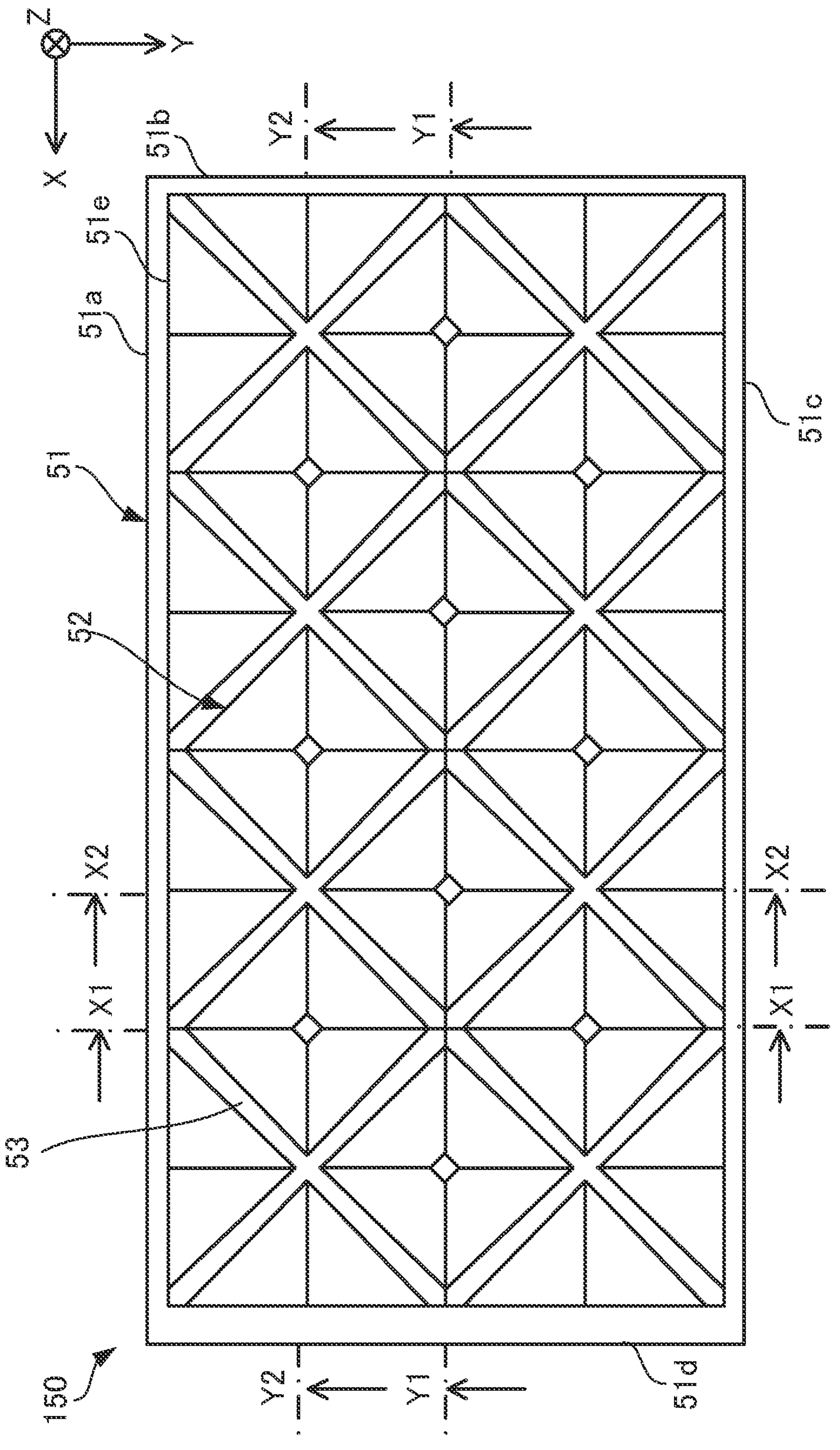
FIG. 14 is a plan view of a bonding end portion of a bonding tool used in a wiring process included in a method for manufacturing a semiconductor device taken as a reference example.
Figure 15A:
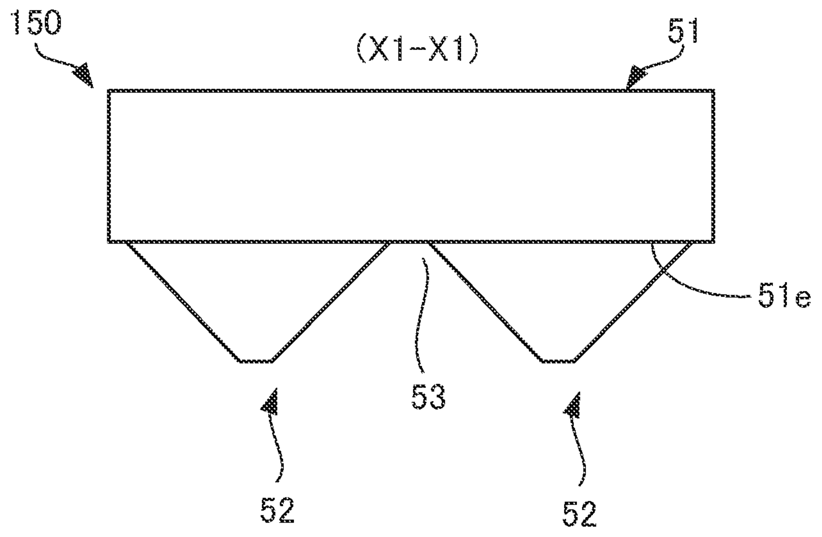
FIGS. 15A and 15B are sectional views of the bonding end portion of the bonding tool used in the wiring process included in the method for manufacturing the semiconductor device taken as the reference example.
Figure 15B:
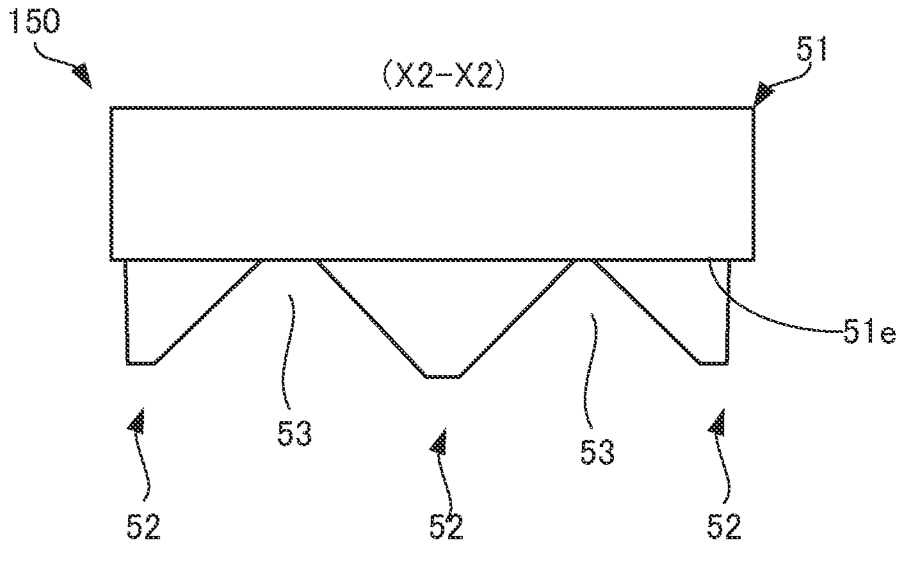
Figure 16:
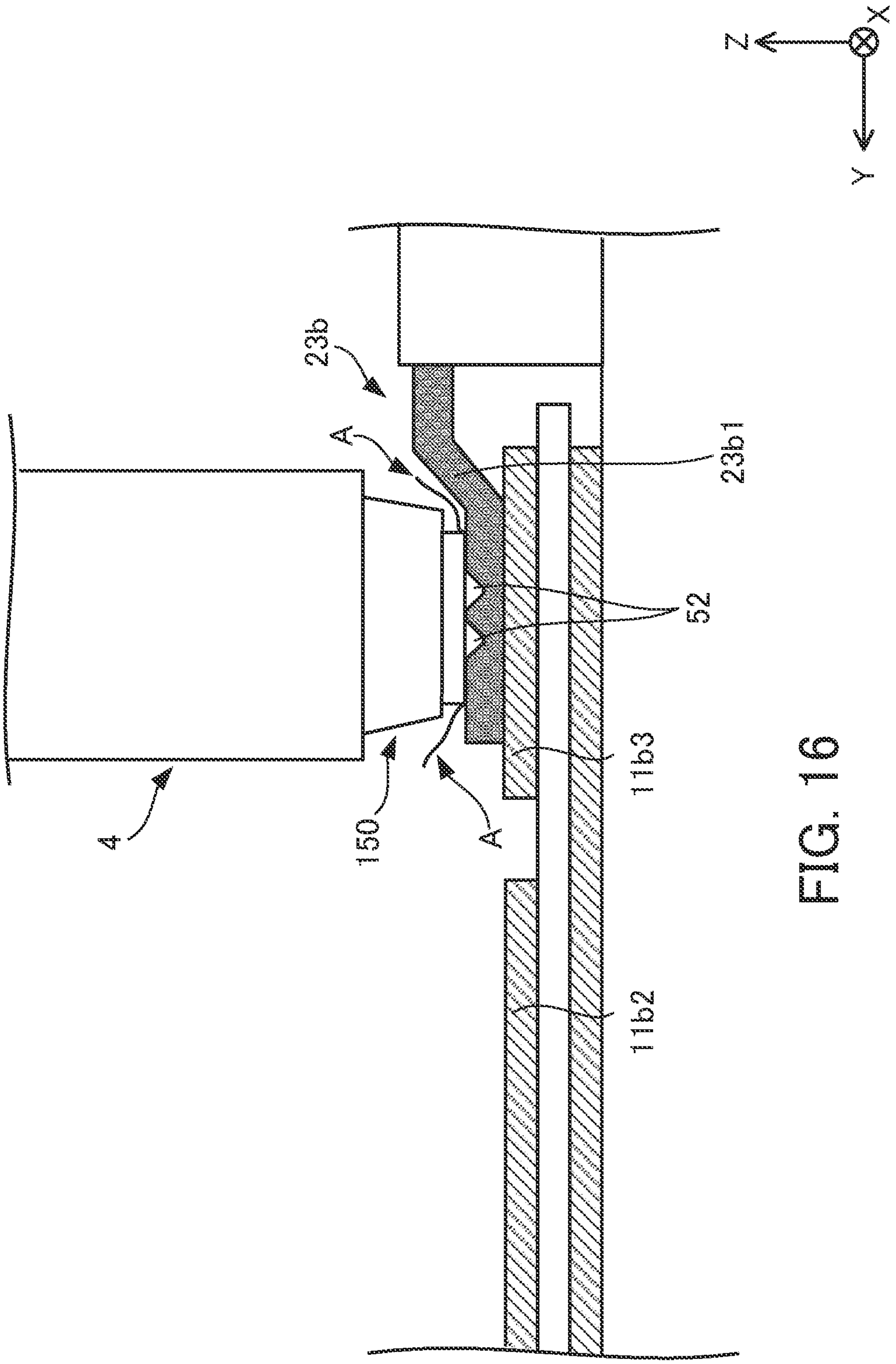
FIG. 16 illustrates bonding in the wiring process included in the method for manufacturing the semiconductor device taken as the reference example (part 1)
Figure 17:
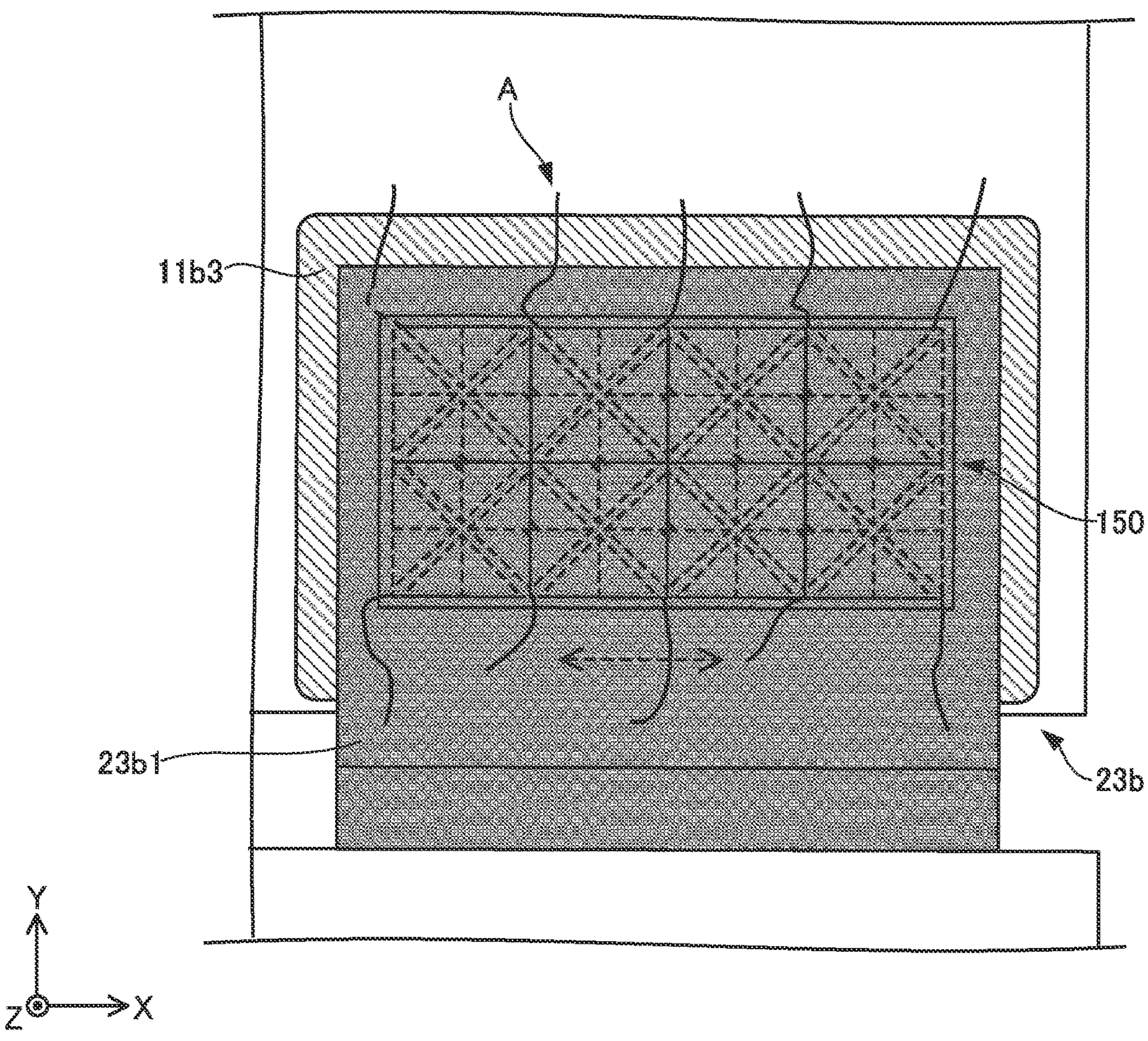
FIG. 17 illustrates bonding in the wiring process included in the method for manufacturing the semiconductor device taken as the reference example (part 2)

A case where the bonding end portion 50 does not include the suppression portion 54 will now be described as a reference example of the bonding tool 4 with reference to FIGS. 14 through 17. FIG. 14 is a plan view of a bonding end portion of a bonding tool used in a wiring process included in a method for manufacturing a semiconductor device taken as a reference example. FIGS. 15A and 15B are sectional views of the bonding end portion of the bonding tool used in the wiring process included in the method for manufacturing the semiconductor device taken as the reference example. FIGS. 16 and 17 illustrate bonding in the wiring process included in the method for manufacturing the semiconductor device taken as the reference example. FIGS. 15A and 15B are sectional views taken along the dot-dash lines X1-X1 and X2-X2, respectively, of FIG. 14. FIG. 16 is a sectional view corresponding to the dot-dash line X1-X1 of FIG. 14 of a bonding end portion 150 which presses a second bonding portion **23*b*1. FIG. 17 is a plan view of the bonding end portion 150 which presses the second bonding portion 23*b*1. In FIG. 17, a plurality of protrusions 52** are indicated by dashed lines.

With the bonding end portion 150, as illustrated in FIG. 14 and FIGS. 15A and 15B, only the plurality of protrusions 52 are formed on an end surface **51*e* with gaps 53 therebetween. The structure of the bonding end portion 150 differs from that of the bonding end portion 50 in the first embodiment only in this respect. Sectional views of the bonding end portion 150 taken along the dot-dash lines Y1-Y1 and Y2-Y2 of FIG. 14 are the same as the sectional views of the bonding end portion 50 of FIGS. 10A and 10B taken along the dot-dash lines Y1-Y1 and Y2-Y2, respectively, of FIG. 9**.

The above bonding tool 4 is used for bonding a bonding portion to a wiring board in the wiring process in step S3 of the flow chart of FIG. 6. A case where the second bonding portion **23*b*1 of the second connection terminal 23*b* is bonded to the wiring board 11*b*3 by the use of the bonding end portion 150 of the bonding tool 4** will now also be described.

The second bonding portion **23*b*1 of the second connection terminal 23*b* is located over the wiring board 11*b*3 and the bonding end portion 150 of the bonding tool 4 is located over the front surface of the second bonding portion 23*b*1. The bonding tool 4 presses the second bonding portion 23*b*1 while vibrating in the ±X directions. As illustrated in FIG. 16, the plurality of protrusions 52 cut into the front surface of the second bonding portion 23*b*1. As a result, impressions are formed by the plurality of protrusions 52 on the front surface of the second bonding portion 23*b*1. When the bonding tool 4 further presses the second bonding portion 23*b*1 while vibrating, the plurality of protrusions 52 of the bonding end portion 150 cut into the second bonding portion 23*b*1 while vibrating. As a result, the second bonding portion 23*b*1 plastically deforms and crushed volume enters each of the narrow gaps 53 between the plurality of protrusions 52**.

The crushed volume enters in this way the narrow gaps 53 between the plurality of protrusions 52. As illustrated in FIG. 16 and FIG. 17, the crushed volume is extruded as foreign substances A having the shape of a thread (mustache) from gaps 53 exposed on the sides of long side portions **51*a* and 51*c* of the bonding end portion 150** to the outside. If these foreign substances A having the shape of a thread come in contact with another wiring board or terminal, then a short circuit occurs.

Accordingly, the bonding tool 4 in the first embodiment includes the bonding end portion 50 which is located over the front surface of the second bonding portion **23*b*1 of the second connection terminal 23*b* located over the wiring board 11*b*3 and which presses the second bonding portion 23*b*1 against the wiring board 11*b*3 for bonding while vibrating in a direction parallel to the front surface of the second bonding portion 23*b*1. The bonding end portion 50 includes the plurality of protrusions 52 formed on the end surface 51*e* and the suppression portion 54 formed along both side portions of the end surface 51*e*** parallel to the vibrating direction.

The suppression portion 54 suppresses foreign substances having the shape of a thread and extruded from gaps 53 on the sides of both side portions of the plurality of protrusions 52 parallel to the vibrating direction. This prevents the occurrence of a short circuit caused by foreign substances having the shape of a thread and suppresses deterioration in the reliability of the semiconductor device 1. In other words, the bonding portion is bonded to only the bonding area of the wiring board, and thus the bonding area is away from an outer periphery of the wiring board in the plan view. Since the foreign substances are not generated, the bonding portion can be maintained to be isolated from the outer periphery of the wiring board, thereby preventing the short.

Second Embodiment

Figure 18:
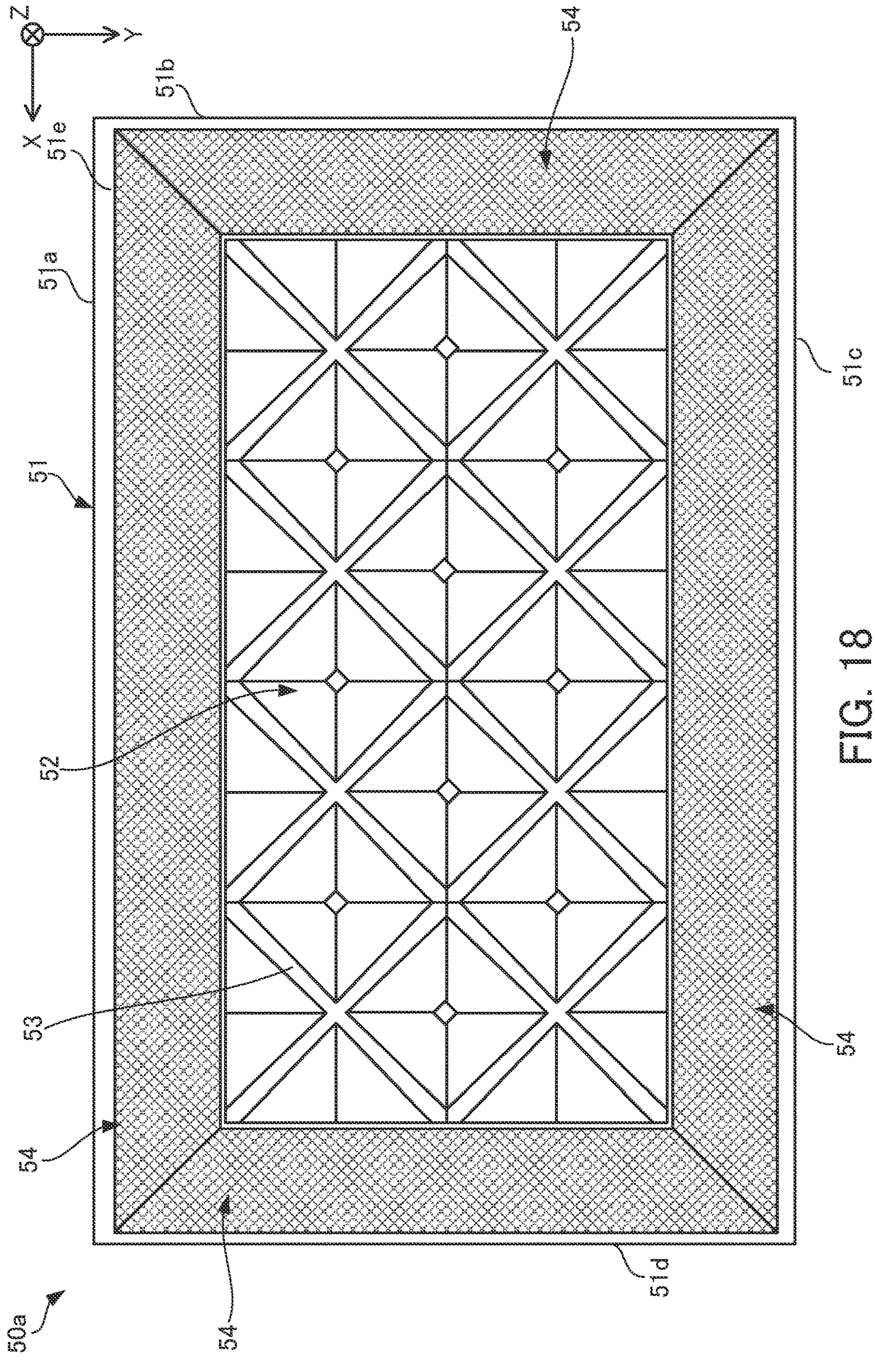
FIG. 18 is a plan view of a bonding end portion of a bonding tool used in a wiring process included in a method for manufacturing a semiconductor device according to a second embodiment.

In second and later embodiments, various forms of a bonding end portion of a bonding tool 4 will be described. A bonding end portion 50*a* in a second embodiment will now be described with reference to FIG. 18. FIG. 18 is a plan view of a bonding end portion of a bonding tool used in a wiring process included in a method for manufacturing a semiconductor device according to a second embodiment.

With the bonding end portion 50*a* in the second embodiment, a suppression portion 54 is formed on the whole of the outer periphery of the end surface 51*e* of the bonding end portion 50 in the first embodiment perpendicular to a direction in which the plurality of protrusions 52 vibrate.

As described in the first embodiment, when the bonding end portion 50 presses the second bonding portion 23*b*1 while vibrating, the foreign substances A are extruded from gaps 53 exposed on the sides of the long side portions 51*a* and 51*c* of the bonding end portion 50. The foreign substances A extruded at this time may also be exposed from the sides of the short side portions 51*b* and 51*d* of the bonding end portion 50.

Accordingly, with the bonding end portion 50*a*, the suppression portion 54 is formed not only on the sides of the long side portions 51*a* and 51*c* but also on the sides of the short side portions 51*b* and 51*d* in order to suppress extrusion of foreign substances A from gaps 53 between the plurality of protrusions 52 on the sides of the short side portions 51*b* and 51*d*. By performing bonding by the use of the bonding tool 4 including the bonding end portion 50*a*, the exposure of foreign substances is suppressed compared with a case where the bonding end portion 50 is used. This further prevents the occurrence of a short circuit caused by foreign substances and reliably suppresses deterioration in the reliability of the semiconductor device 1.

Third Embodiment

Figure 19:
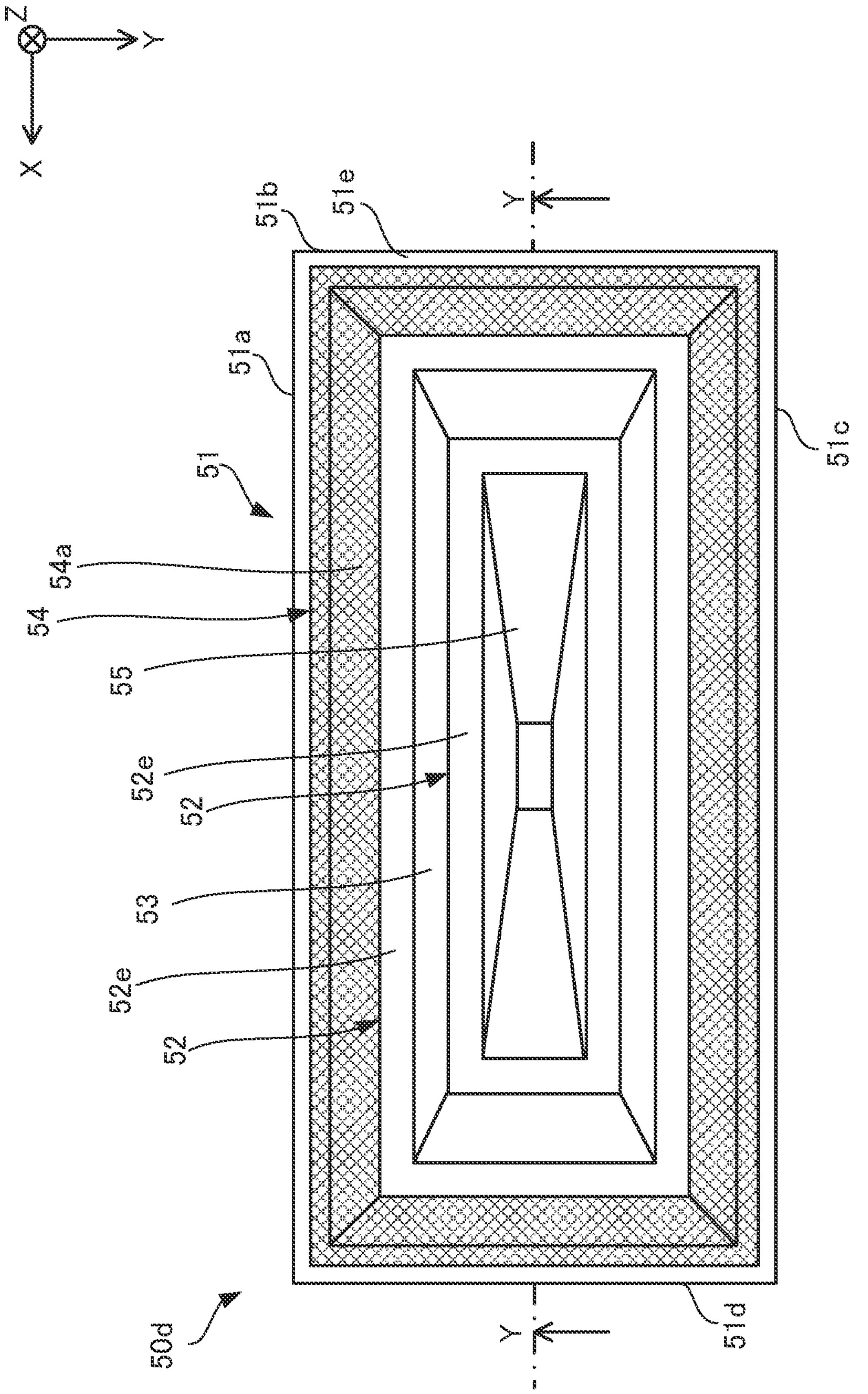
FIG. 19 is a plan view of a bonding end portion of a bonding tool used in a wiring process included in a method for manufacturing a semiconductor device according to a third embodiment.
Figure 20:
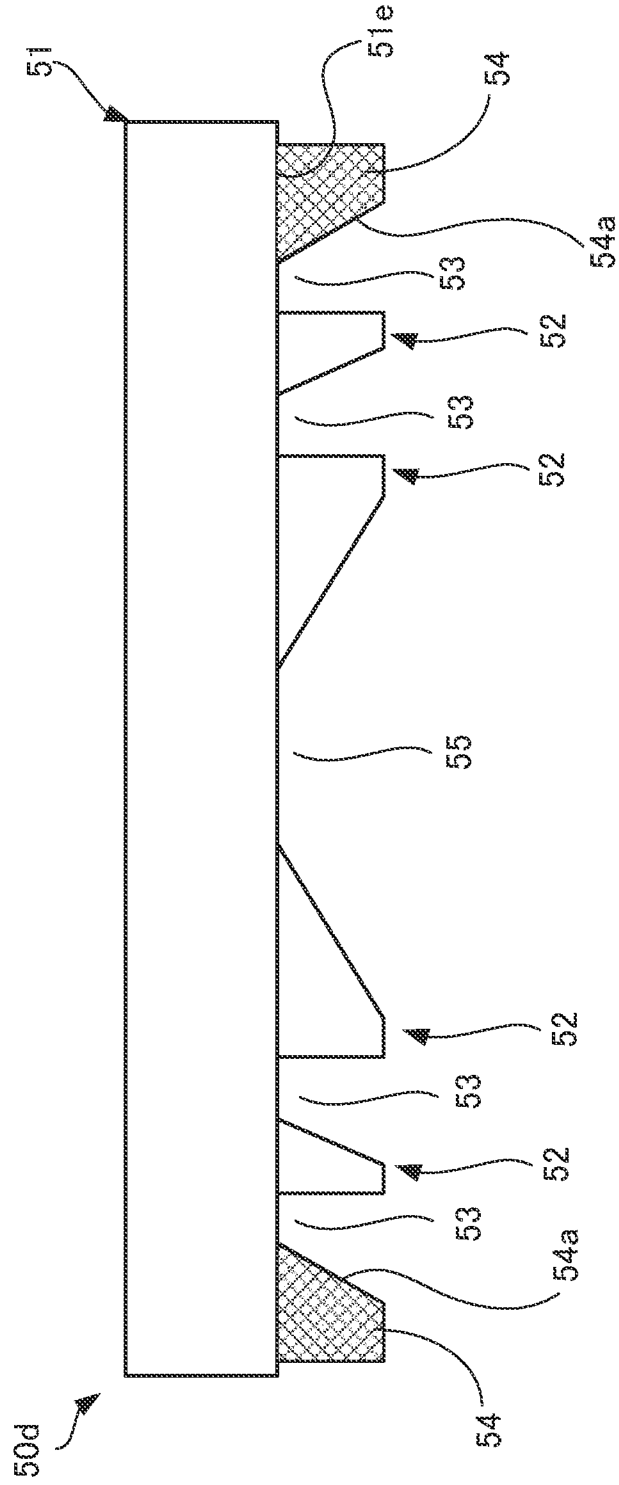
FIG. 20 is a sectional view of the bonding end portion of the bonding tool used in the wiring process included in the method for manufacturing the semiconductor device according to the third embodiment.

A bonding end portion 50*d* included in a bonding tool 4 in a third embodiment will be described with reference to FIG. 19 and FIG. 20. FIG. 19 is a plan view of a bonding end portion of a bonding tool used in a wiring process included in a method for manufacturing a semiconductor device according to a third embodiment. FIG. 20 is a sectional view of the bonding end portion of the bonding tool used in the wiring process included in the method for manufacturing the semiconductor device according to the third embodiment. FIG. is a sectional view of the bonding end portion of the bonding tool of FIG. 19 taken along the dot-dash line Y-Y of FIG. 19.

In the third embodiment, a case where protrusions 52 and a suppression portion 54 included in the bonding end portion 50*d* are circular will be described. The structure of the bonding end portion 50*d* differs from that of the bonding end portion 50 or 50*a* in the first or second embodiment only in this respect.

With the bonding end portion 50*d*, protrusions 52 are formed in the center of an end surface 51*e*. The protrusions 52 are continuously circular and are in two layers, in plan view. That is to say, a protrusion 52 corresponding to one layer is formed in the center of the end surface 51*e*. This protrusion 52 is continuously circular and surrounds a central area 55. This protrusion 52 has an inclined surface which faces the central area 55 and which forms an obtuse angle with the end surface 51*e*. A protrusion 52 corresponding to the other layer is formed with a gap 53 between the above protrusion 52 and this protrusion 52. This protrusion 52 also has an inclined surface which faces the inside protrusion 52 and which forms an obtuse angle with the end surface 51*e*. A case where the protrusions 52 which are in two layers are formed is simply taken as an example. A protrusion 52 which is in one layer and which surrounds the central area 55 in plan view or protrusions 52 which are in many (three or more) layers and which surround the central area 55 in plan view may be formed. Each of these protrusions 52 also includes a flat pressing surface 52*e* at the peak portion. Each protrusion 52 includes portions parallel to a long side portion 51*a*, a short side portion 51*b*, a long side portion 51*c*, and a short side portion 51*d*. However, corner portions of the inner periphery and outer periphery of each protrusion 52 may be R-chamfered. Furthermore, the central area 55 is rectangular in plan view. That is to say, the central area 55 is parallel in plan view to the long side portion 51*a*, the short side portion 51*b*, the long side portion 51*c*, and the short side portion 51*d*. However, the central area 55 may be circular or elliptic in plan view.

In addition, the suppression portion 54 is formed on the outermost periphery of the end surface 51*e* outside the outermost protrusion 52. The suppression portion 54 includes portions parallel to the long side portion 51*a*, the short side portion 51*b*, the long side portion 51*c*, and the short side portion 51*d*. The suppression portion 54 includes a suppression surface 54*a*. The suppression surface 54*a* inclines with respect to the end surface 51*e* and forms an obtuse angle with the end surface 51*e*. The suppression surface 54*a* surrounds the outermost protrusion 52 continuously and circularly.

Furthermore, corner portions of the inner periphery and outer periphery of the suppression portion 54 may also be R-chamfered. In addition, the height of the suppression portion 54 from the end surface 51*e* may also be approximately equal to the height of the plurality of protrusions 52 from the end surface 51*e* or be greater than the height of the plurality of protrusions 52 from the end surface 51*e*. In this case, for example, the height of the suppression portion 54 from the end surface 51*e* is greater than or equal to 100 percent of the height of the plurality of protrusions 52 from the end surface 51*e* and smaller than or equal to 150 percent of the height of the plurality of protrusions 52 from the end surface 51*e*.

The bonding end portion 50*d* included in the bonding tool 4 also presses the second bonding portion 23*b*1, while vibrating in the ±X directions. Accordingly, crushed volume may be extruded as foreign substances A from the gaps 53 exposed on the sides of the long side portions 51*a* and 51*c* of the bonding end portion 50*d* to the outside. At this time, the suppression surface 54*a* suppresses the extruded foreign substances A. Furthermore, the bonding end portion 50*d* includes the suppression surface 54*a* around the plurality of protrusions 52. By performing bonding by the use of the bonding tool 4 including the bonding end portion 50*d*, the exposure of foreign substances is suppressed further. This further prevents the occurrence of a short circuit caused by foreign substances and reliably suppresses deterioration in the reliability of the semiconductor device 1.

According to the disclosed techniques, the occurrence of a short circuit is prevented by preventing the generation of foreign substances and deterioration in the reliability of a semiconductor device is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A bonding tool for bonding two conductive plates by pressing the bonding tool against the two conductive plates while vibrating the bonding tool in a direction parallel to the two conductive plates, the bonding tool comprising:

a bonding end portion including a bonding base having an end surface, the end surface having a protrusion area having two sides that face each other and that extend in a first direction that is parallel to the end surface, and a pair of suppression areas respectively provided adjacent to and along the two sides of the protrusion area;

a plurality of protrusions provided in the protrusion area of the end surface; and a pair of suppression portions respectively provided on the end surface in the suppression areas, and linearly extending between opposing ends of respective ones of the two sides of the protrusion area to sandwich the plurality of protrusions therebetween, wherein the bonding end portion is configured to vibrate in the first direction.

2. The bonding tool according to claim 1, wherein the end surface of the bonding base is rectangular in a plan view of the bonding tool, the end surface having a pair of long sides parallel to each other in the first direction and a pair of short sides parallel to each other in a second direction orthogonal to the first direction.

3. The bonding tool according to claim 2, wherein each of the plurality of protrusions has a bottom surface contacting the end surface, the bottom surfaces of the plurality of protrusions being disposed on the end surface to have gaps between one another.

4. The bonding tool according to claim 1, wherein the pair of suppression areas are respectively provided adjacent to and along the entire length of the two sides of the protrusion area.

5. The bonding tool according to claim 2, further comprising:

a pair of other suppression areas respectively provided adjacent to and along the pair of short sides; and a pair of other suppression portions respectively provided on the end surface in the other suppression areas and linearly extending between opposing ends of respective ones of the pair of short sides of the protrusion area to sandwich the plurality of protrusions in the first direction.

6. The bonding tool according to claim 5, wherein each of the suppression portions includes a suppression surface facing the plurality of protrusions.

7. The bonding tool according to claim 6, wherein the suppression surface and the end surface form an obtuse angle.

8. The bonding tool according to claim 5, wherein, measured from the end surface in a direction orthogonal to the end surface, a height of the suppression portion is equal to or greater than a height of the plurality of protrusions.

9. The bonding tool according to claim 3, wherein each of the plurality of protrusions has a shape of a polygonal pyramid or a cone.

10. The bonding tool according to claim 3, wherein:

the plurality of protrusions each continuously and circularly extend to surround a center of the end surface in the plan view so as to form a plurality of layers from the center toward a periphery of the end surface; and the suppression portion is provided on the end surface so as to surround a plurality of protrusions.

11. A semiconductor device manufacturing method, comprising:

providing a wiring board and a connection terminal of the semiconductor device being manufactured, the connection terminal including a bonding portion that is a flat plate; and providing the bonding tool according to claim 1; and bonding the bonding portion of the connection terminal to the wiring board by placing the bonding portion on the wiring board, locating the bonding end portion of the bonding tool over a front surface of the bonding portion, and pressing the bonding portion against the wiring board for bonding while vibrating the bonding tool in the first direction.

12. The semiconductor device manufacturing method according to claim 11, wherein the bonding the bonding portion includes placing the end surface of the bonding tool on the bonding portion such that a center of the bonding portion is pressed by the bonding end portion while bonding.

13. A semiconductor device, comprising:

a semiconductor chip;

a connection terminal including a bonding portion that is a flat plate;

a plurality of wiring boards including a first wiring board on which the semiconductor chip is placed and a second wiring board having a bonding area on which the bonding portion of the connection terminal is bonded, the bonding area being located away from an outer periphery of the bonding portion of the connection terminal in a plan view of the semiconductor device, such that the bonding portion is bonded to only the bonding area and is isolated from the second wiring board at the outer periphery of the bonding portion.

* * * * *